(12) United States Patent
Kishine et al.

(10) Patent No.: US 7,095,816 B2
(45) Date of Patent: Aug. 22, 2006

(54) CLOCK/DATA RECOVERY CIRCUIT

(75) Inventors: Keiji Kishine, Yokohama (JP); Haruhiko Ichino, Yokosuka (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 861 days.

(21) Appl. No.: 10/092,089

(22) Filed: Mar. 5, 2002

(65) Prior Publication Data

US 2002/0159556 A1  Oct. 31, 2002

(30) Foreign Application Priority Data

Mar. 7, 2001 (JP) ............................. 2001-063775
Oct. 24, 2001 (JP) ............................. 2001-326090

(51) Int. Cl.
*H04L 7/00* (2006.01)
*H04J 3/07* (2006.01)
*H03L 7/00* (2006.01)

(52) U.S. Cl. ................. 375/355; 327/156; 327/141; 370/395.62; 370/503; 370/535; 375/354; 375/376

(58) Field of Classification Search ........ 375/354–376; 327/141–163, 113, 115, 156–157; 370/395.62, 370/503, 535

See application file for complete search history.

(56) References Cited

U.S. PATENT DOCUMENTS

| | | | |
|---|---|---|---|
| 5,001,711 A * | 3/1991 | Obana et al. ............. 370/535 |
| 5,703,511 A * | 12/1997 | Okamoto ................. 327/157 |
| 5,933,058 A * | 8/1999 | Pinto et al. ............... 331/17 |
| 6,178,213 B1 * | 1/2001 | McCormack et al. ....... 375/355 |
| 6,259,755 B1 | 7/2001 | O'Sullivan et al. |
| 6,333,678 B1 * | 12/2001 | Brown et al. .............. 331/2 |
| 6,359,519 B1 * | 3/2002 | Farrow ..................... 331/57 |
| 6,671,342 B1 * | 12/2003 | Lin et al. .................. 375/375 |
| 6,809,562 B1 * | 10/2004 | Wada et al. ............... 327/113 |

FOREIGN PATENT DOCUMENTS

| | | |
|---|---|---|
| JP | 5-56410 | 3/1993 |
| JP | 06252654 | 9/1994 |
| JP | 10126400 | 5/1998 |
| JP | 10-285150 | 10/1998 |
| JP | 11055082 | 2/1999 |

OTHER PUBLICATIONS

Noboru Ishihara, Yukio Akazawa, "A Monolithic 156 Mb/s Clock and Data Recovery PLL Circuit Using the Sample-and-Hold Technique", IEEE Journal of Solid-State Circuits, vol. 29, No. 12, Dec. 1994, pp. 1566-1571.

(Continued)

*Primary Examiner*—Dac Ha
*Assistant Examiner*—Linda Wong
(74) *Attorney, Agent, or Firm*—Kenyon & Kenyon LLP

(57) ABSTRACT

A clock/data recovery circuit used in a receiving apparatus is provided in the circuit including: a voltage control oscillator for generating a clock signal of a frequency of 1/K of a bit rate of an input data signal; a delay circuit; a demultiplexer for demultiplexing the input data signal; a multiplexer for multiplexing the demultiplexed signals; a phase comparator for comparing phases of an output signal of the delay circuit and an output signal of the multiplexer; a lowpass filter; wherein the clock/data recovery circuit outputs the clock signal generated by the voltage control oscillator as a recovery divided clock signal, and outputs the demultiplexed signals output as recovery parallel data signals.

18 Claims, 44 Drawing Sheets

OTHER PUBLICATIONS

D. Clawin, U. Langmann, "Multigigabit/second Silicon Decision Circuit", ISSCC 85, Feb. 1985, pp. 222-223.

M. Wurzer, J. Bock, W. Zirwas, H. Knapp, F. Schumann, A. Felder, L. Treitinger, "40Gb/s Integrated Clock and Data Recovery Circuit in a Silicon Bipolar Technology", IEEE BCTM 8.1, Sep. 27-29, 1998.

J. Savoj, B. Razavi, "A 10 Gb/s CMOS Clock and Data Recovery Circuit with Frequency Detection", ISSCC 2001, Feb. 5, 2001.

D. Clawin, U. Langmann, B.G. Bosch, "Silicon Bipolar Decision Circuit Handling Bit Rates up to 5Gbit/s", Journal of lightwave technology, vol. LT-5, No. 3, Mar. 1987, pp. 348-354.

Müllner et al., "A 20 Gbit/s Parallel Phase Detector and Demultiplexer Circuit in a Production Silicon Bipolar Technology with $f_T$=25 GHz", BIPOLAR/BICMOS Circuits and Technology Meeting, IEEE, Sep. 29, 1996, pp. 43-45.

J. Savoj, B. Razavi, "A 10 Gb/s CMOS Clock and Data Recovery Circuit", 2000 Symposium on VLSI Circuits Digest of Technical Papers, pp. 136-139.

International Search Report, EP 02 25 1533, Oct. 13, 2005.

M. Wurzer et al., "A 40-Gb/s Integrated Clock and Data Recovery Circuit in a 50-GHz Silicon Bipolar Technology," IEEE J. Solid-State Circuits, vol. 34, No. 9, pp. 1320-1324 Sep. 1999.

* cited by examiner

FIG.40

| DY2 | DF2 | COM1 |
|---|---|---|
| 0(LOW LEVEL) | 0(LOW LEVEL) | 0 (MID-LEVEL IN THREE VALUES) |
| 0(LOW LEVEL) | 1(HIGH LEVEL) | 0 (MID-LEVEL IN THREE VALUES) |
| 1(HIGH LEVEL) | 0(LOW LEVEL) | 1 (HIGH LEVEL IN THREE VALUES) |
| 1(HIGH LEVEL) | 1(HIGH LEVEL) | −1 (LOW LEVEL IN THREE VALUES) |

CLOCK/DATA RECOVERY CIRCUIT

BACKGROUND OF THE INVENTION

1. Field of the Invention

The present invention relates to a clock/data recovery circuit using a voltage control oscillator which generates a clock signal of a frequency corresponding to 1/K (K=2, 3, ...) of bit rate of an input data signal.

2. Description of the Related Art

The clock/data recovery circuit is applied to a receiver part and the like of an optical front end circuit in a router or a cross-connect switch of point to point transmission, GbE/10GbE, Fibre Channel in an optical communication system.

FIG. 1 shows a configuration of a conventional clock/data recovery circuit. This configuration is a PLL configuration using the voltage control oscillator which outputs a clock signal of a frequency of 1/2 of bit rate of an input data signal (refer to: M. Wurzer, et. al., "A 40-Gb/s Integrated Clock and Data Recovery Circuit in a 50-GHz Silicon Bipolar Technology," IEEE J. Solid-State Circuits, VOL. 34, NO. 9, pp. 1320–1324 September 1999).

This clock/data recovery circuit includes a voltage control oscillator (VOC) 51 which outputs a clock signal CLK1 at a frequency of 1/2 of bit rate of an input data signal DIN, D-type ms-flip flop circuits (DFF) 52 and 53 (which write data at a rising edge), a 90-degree delay circuit 54 which delays phase of a signal by 90-degree, a D-type ms-flip flop circuit 55 which receives a clock signal CLK2 output from the 90-degree delay circuit 54, an EXOR circuit 56 which compares phases of signals D2 and D3 output from D-type ms-flip flop circuits 53 and 55, a lowpass filter (LPF) 57 which extracts DC voltage from the phase compared signal output from the EXOR circuit 56 and inputs the DC voltage to the voltage control oscillator 51 as a control voltage. D1 is an output signal of the D-type ms-flip flop circuit 52.

FIG. 2 shows a timing chart of the signals DIN, D2, CLK1, CLK2 of the clock/data recovery circuit. (a), (b), (c) indicate a lock status, a lead status of the clock signal CLK1 and a lag status of the clock signal CLK1 respectively.

In the lock status shown in FIG. 2(a), the rising/falling edge of the clock signal CLK1 becomes the same timing as a center between edges of the input data signal DIN, and the rising/falling edge of the clock signal CLK2 becomes the same timing as an edge of the input data signal DIN.

When there are data transitions (1→0, 0→1) in the input data signal DIN, the EXOR circuit 56 outputs an output signal according to lead/lag relationship of the phase of the input data signal DIN and the clock signal CLK1.

In the case that there are transitions between data A and data B of the input data signal DIN, in the status of clock lead shown in FIG. 2(b), both of the D-type ms-flip flop circuits 53, 55 discriminates data A, so that the output signals D2 and D3 become the same sign. On the other hand, in the lag status shown in FIG. 2(c), since the D-type ms-flip flop circuit 53 discriminates data A and the D-type ms-flip flop circuit 55 discriminates data B, the sign of the output signals D2 and D3 becomes different.

Therefore, when there are data transitions in the input data signal DIN, the output signal of the EXOR circuit 56 is determined according to lead/lag status of the clock signal CLK1 with respect to the input data signal DIN. Then, a DC signal obtained by extracting DC voltage from the output signal by the lowpass filter 57 is input to the voltage control oscillator 51 as the feedback signal.

Accordingly, a clock/data recovery circuit which can perform pull-in by using the voltage control oscillator having an oscillation frequency of a half of an oscillation frequency of a voltage control oscillator of a clock/data recovery circuit using PLL can be realized.

However, FIG. 2(a) represents a timing chart of the ideal lock status. The edge of the clock signals CLK1 and CLK2 of FIG. 1 in an actual lock status repeats, as shown in FIG. 3(a), lead/lag movement with respect to the phase of the input data signal DIN around the pulse center t1 and the edge t2 of the input data signal DIN.

Assuming that the number of transitions of the input data signal DIN (the number of changes 1→0 or 0→1) for a time unit is NTR, the number of cases that phases of the clock signals CLK1, CLK2 are in the lead status for the input data signal DIN is NLEAD, and the number of cases that the phases are in the lag status is NLAG (=NTR−NLEAD), and the ratio of the lead/lag status number is RLL, RLL can be represented as RLL=NLEAD/NLAG (1). Accordingly, the ratio of the number of cases that the output of the EXOR circuit 56 is 1 to the number of cases that the output of the EXOR circuit 56 is 0 is determined, so that the output voltage of the lowpass filter 57 which is fed back to the voltage control oscillator 51 can be determined.

Assuming that free-running frequency of the voltage control oscillator 51 is fo(Hz) and the bit rate of the input data signal DIN is Br[b/s], the feedback voltage to the voltage control oscillator 51 in the lock status is in proportion to the difference fd between 2fo and Br. Therefore, the ratio of 1/0 of the output signal of the EXOR circuit in the lock status is in proportionate to fd. As a result, a relationship RLL∝fd holds true.

Although the ratio RLL of the lead/lag status number is determined by feeding a voltage proportionate to fd back to the voltage control oscillator 51, the phase difference (the magnitude of lead/lag) is not decided. That is, there may be a case in which RLL is the same and the phase magnitude of each lead/lag status is different (FIG. 3(b), (c)). FIG. 3(b) shows a case when the magnitude of lead/lag is small and FIG. 3(c) shows a case when the amount of lead/lag is large.

In FIG. 3(b), (c), even when RLL is the same and the feedback voltage to the voltage control oscillator 51 becomes the same, clock jitter in FIG. 3(c) is larger since the phase magnitude is different. In the status that the feedback voltage to the voltage control oscillator 51 becomes the same, the range of clock phase change in each lead/lag is ±90-degree. That is, when the bit rate of the input data signal DIN is BR[b/s]and α is jitter [s]pp due to noise generated in the component, the jitter can be represented as $$1/(BR)+\alpha[s]pp \qquad (3)$$

Thus, there is a large problem in that large jitter is generated.

Another example of the conventional CDR (Clock and Data Recovery), as shown in FIG. 4, is one using VCO having the same oscillation frequency as the input data bit rate. This CDR circuit extracts a clock signal CLK from the input data signal DATAIN, discriminates data signal. By adding a demultiplexer (DEMUX) and by inputting CDR clock output and data output into the DEMUX, the DEMUX outputs low speed parallel data signals demultiplexed of serial data signal output from CDR. Compared with the first conventional CDR, according to this configuration, the operation speed required for VCO becomes double and there is a problem in that speedup becomes difficult.

SUMMARY OF THE INVENTION

An object of the present invention is to provide a clock/data recovery circuit realizing low jitter while a voltage control oscillator which oscillates at 1/K frequency of the bit rate of the input data signal is used.

In addition, the object of the present invention is to provide a clock/data recovery circuit realizing a serial signal output function (clock and data) in addition to a parallel signal output function.

The above object is achieved by a clock/data recovery circuit including:

a voltage control oscillator for generating a clock signal of a frequency of 1/K (K=2, 3, . . . ) of a bit rate of an input data signal;

a delay circuit for delaying the input data signal for timing adjustment;

a demultiplexer for demultiplexing the input data signal into M demultiplexed signals (M=2, 3, . . . ) by using the clock signal;

a multiplexer for multiplexing the M demultiplexed signals by using the clock signal;

a phase comparator for comparing phases of an output signal of the delay circuit and an output signal of the multiplexer;

a lowpass filter for extracting DC voltage from an output signal of the phase comparator and for inputting the DC voltage to the voltage control oscillator as a control voltage;

wherein the clock/data recovery circuit outputs the clock signal generated by the voltage control oscillator as a recovery divided clock signal, and outputs the M demultiplexed signals from the demultiplexer as recovery parallel data signals.

In the above clock/data recovery circuit, M=K×L in which L is a natural number.

The clock/data recovery circuit may includes:

another delay circuit, provided before the delay circuit, for delaying the input data signal; and another phase comparator, instead of the phase comparator, for comparing phases of the output signal of the delay circuit and the output signal of the multiplexer, and comparing phases of a result of comparison of phases of the output signal of the delay circuit and the output signal of the multiplexer and an output signal of the another delay circuit.

In the clock/data recovery circuit, when K=2 and M=2, the demultiplexer may include:

a first D-type ms-flip flop circuit for receiving the input data signal by using the clock signal; and a second D-type ms-flip flop circuit for receiving the input data signal by using an inverted signal of the clock signal; and the multiplexer may include:

a clock delay circuit for delaying the clock signal; and a selector for selecting alternately an output signal of the first D-type ms-flip flop circuit and an output signal of the second D-type ms-flip flop circuit by using an output signal of the clock delay circuit.

In the clock/data recovery circuit, when K=2, the demultiplexer may include:

a first demultiplexer for demultiplexing the input data signal into two first parallel data signals by using the clock signal;

two second demultiplexers each of which demultiplexes one of the first parallel signals into L second parallel data signals by using a divided clock signal generated dividing the clock signal by L and the clock signal; and the multiplexer may include:

two first multiplexers each of which multiplexes the L second parallel data signals into serial data by using the divided clock signal and the clock signal; and a second multiplexer for multiplexing two parallel data signals output from the two first multiplexer into serial data by using the clock signal.

In the clock/data recovery circuit, when K=2 and M=$2^T$ (T is an integer equal to or larger than 2), the demultiplexer may include:

T stages in which a Qth (Q=1, 2, 3 . . . T) stage includes $2^{(Q-1)}$ 1:2 demultiplexers, and a divided clock signal generated by dividing the clock signal by $2^{(Q-1)}$ is provided to each 1:2 demultiplexer in the Qth stage; and the multiplexer may include:

T stages in which a Qth (Q=1, 2, 3 . . . T) stage includes $2^{(T-Q)}$ 2:1 multiplexers, a divided clock signal generated by dividing the clock signal by $2^{(T-Q)}$ is provided to each 2:1 multiplexer.

In the clock/data recovery circuit, when K>2, the demultiplexer may include:

a part for generating K−1 signals in which phases are different each other with respect to the clock signal;

a first demultiplexer for demultiplexing the input data signal into K first parallel data signals by using the K−1 signals and the clock signal; and K second demultiplexers each of which demultiplexes one of the first parallel data signals into L second parallel data signals; and the multiplexer may include:

K first multiplexer each of which multiplexes the L second parallel data signals into serial data by using the divided clock signal and the clock signal; and a second multiplexer for multiplexing K parallel data signals output from the K first multiplexers into serial data by using a multiplied signal generated by multiplying the clock signal and the clock signal.

The above object can be also achieved by a clock/data recovery circuit including:

a voltage control oscillator for generating a clock signal of a frequency of 1/K (K=2, 3, . . . ) of a bit rate of an input data signal;

a Q divider for receiving the input data signal and for dividing a frequency of the input data signal by Q (Q=2, 3, 4 . . . );

a first demultiplexer for demultiplexing an output signal of the Q divider into M demultiplexed signals (M=2, 3, . . . ) by using the clock signal;

a second demultiplexer for demultiplexing the input data signal into N demultiplexed signals by using the clock signal;

a multiplexer for multiplexing the M demultiplexed signals output from the first demultiplexer into a signal by using the clock signal;

a phase comparator for comparing phases of an output signal of the Q divider and an output signal of the multiplexer;

a lowpass filter for extracting DC voltage from an output signal of the phase comparator and for inputting the DC voltage to the voltage control oscillator as a control voltage; and an m (=N/K) divider for dividing a frequency of an output clock signal of the voltage control oscillator by m;

wherein the clock/data recovery circuit outputs an output signal of the m divider as a recovery divided signal, and outputs the N demultiplexed signals output from the second demultiplexer as recovery parallel data signals.

In the clock/data recovery circuit, M=K×L in which L is a natural number.

The clock/data recovery circuit may include:

a delay circuit provided after the Q divider (Q=2, 3, 4. . . ); and another phase comparator, instead of the phase comparator, for comparing phases of an output signal of the delay circuit and the output signal of the multiplexer, and comparing phases of a result of comparison of phases of the output signal of the delay circuit and the output signal of the multiplexer and an output signal of the Q divider.

In the clock/data recovery circuit, when K=2 and M=2, the first demultiplexer may include:

a first D-type ms-flip flop circuit for receiving an output signal of the Q divider by using the clock signal; and a second D-type ms-flip flop circuit for receiving an output signal of the Q divider by using an inverted signal of the clock signal; and the multiplexer may include:

a clock delay circuit for delaying the clock signal; and a selector for selecting alternately an output signal of the first D-type ms-flip flop circuit and an output signal of the second D-type ms-flip flop circuit by using an output signal of the clock delay circuit.

In the clock/data recovery circuit, when K=2, the clock/data recovery circuit may include:

an m divider for outputting a divided clock signal generated by dividing the clock signal by m;

a 90-degree delay circuit for delaying the clock signal from the voltage control oscillator by 90 degree; and a multiplier for multiplying an output signal from the 90-degree delay circuit and a clock signal from the voltage control oscillator, and outputting a clock signal the frequency of which is the same as bit rate of the input data signal;

wherein the-clock/data recovery circuit outputs a data signal from the multiplexer and a clock signal from the multiplier as a serial data signal.

In the clock/data recovery circuit, instead of providing the 90-degree delay circuit, the voltage control oscillator outputs a quadrature clock signal having the same frequency as the clock signal and being quadrature to the clock signal, the multiplier receives the clock signal and the quadrature clock signal and outputs a clock signal having the same frequency as bit rate of the input data signal.

The clock/data recovery circuit may include:

an m divider for outputting a divided clock signal generated by dividing the clock signal by m; and a K multiplier for multiplying the clock signal by K, so that a clock-signal having the same frequency as bit rate of the input data signal is output;

wherein the clock/data recovery circuit outputs a data signal from the multiplexer and a clock signal from the K multiplier as a serial data signal.

In the clock/data recovery circuit, the voltage control oscillator may include 2 k (k≧1) buffer circuits having the same delay time in which the delay time is controlled by a control voltage, the buffer circuits being connected in series, an inverted signal of output of 2 kth buffer circuit is input to a first stage buffer circuit;

and an input of the first stage buffer circuit is the clock signal and an output of kth stage buffer circuit is the quadrature clock signal.

In the clock/data recovery circuit, the K multiplier may include:

a first phase comparator, a lowpass filter for extracting DC voltage from an output signal of the first phase comparator;

a first voltage control oscillator in which the oscillation frequency is controlled by an output signal of the first lowpass filter; and a K divider for dividing an output signal of the first voltage control oscillator by K wherein the first phase comparator receives an output signal of the K divider and the clock signal of the voltage control oscillator, and the first voltage control oscillator outputs a clock signal having the same frequency as bit rate of the input data signal.

In addition, the above object can be also achieved by a receiving apparatus including a clock/data recovery circuit, the clock/data recovery circuit including:

a voltage control oscillator for generating a clock signal of a frequency of 1/K (K=2, 3, . . . ) of a bit rate of an input data signal;

a delay circuit for delaying the input data signal for timing adjustment;

a demultiplexer for demultiplexing the input data signal into M demultiplexed signals (M=2, 3, . . . ) by using the clock signal;

a multiplexer for multiplexing the M demultiplexed signals by using the clock signal;

a phase comparator for comparing phases of an output signal of the delay circuit and an output signal of the multiplexer;

a lowpass filter for extracting DC voltage from an output signal of the phase comparator and inputting the DC voltage to the voltage control oscillator as a control voltage;

wherein the clock/data recovery circuit outputs the clock signal generated by the voltage control oscillator as a recovery divided clock signal, and outputs the M demultiplexed signals output from the demultiplexer as recovery parallel data signals.

According to the present invention, the input data signal is converted into a data signal in which the phase corresponds with that of the output clock signal of the voltage control oscillator by performing demultiplexing/multiplexing operation. By comparing phases of this data signal and the input data signal, the phase comparison signal according to the phase difference can be output even when a voltage control oscillator of frequency of 1/2 of that of the conventional circuit is used, and the feedback voltage to the voltage control oscillator becomes a voltage according to phase difference. Thus, low jitter-can be realized.

In addition, according to the present invention, a receiving apparatus including the clock/data recovery circuit can be provided. The receiving apparatus can be applied to an optical front end circuit receiver and the like in a router or in a cross connect part in SDH/SONET, point to point transmission, GbE/10GbE and Fiber Channel in an optical communication system. According to the receiving apparatus, the low jitter, small size and low power consumption can be realized. As a result, lowering cost of an optical front end module can be realized and the cost of a communication system can be decreased.

BRIEF DESCRIPTION OF THE DRAWINGS

Other objects, features and advantages of the present invention will become more apparent from the following detailed description when read in conjunction with the accompanying drawings, in which:

FIG. 40 is a figure for explaining logic operation of combining circuit in a circuit of FIG. 39;

DETAILED DESCRIPTION OF THE PREFERRED EMBODIMENTS

According to the present invention, oscillation signal of voltage control oscillator which oscillates a clock signal of 1/K frequency of bit rate of the input data signal is used, data signal the phase timing of which coincides with that of the oscillation signal of the voltage control oscillator is generated by performing demultiplexing and multiplexing for the input signal, the phase of this data signal is compared with the phase of the input data signal by the phase comparator. According to such a PLL configuration, output signal phase of the voltage control oscillator is determined uniquely according to difference between a value two times of free-running frequency of the voltage control oscillator and the bit rate value of the input data signal in the lock status, and low jitter can be realized. Thus, the performance of the clock/data recovery circuit can be enhanced.

First Embodiment

Figure 5:
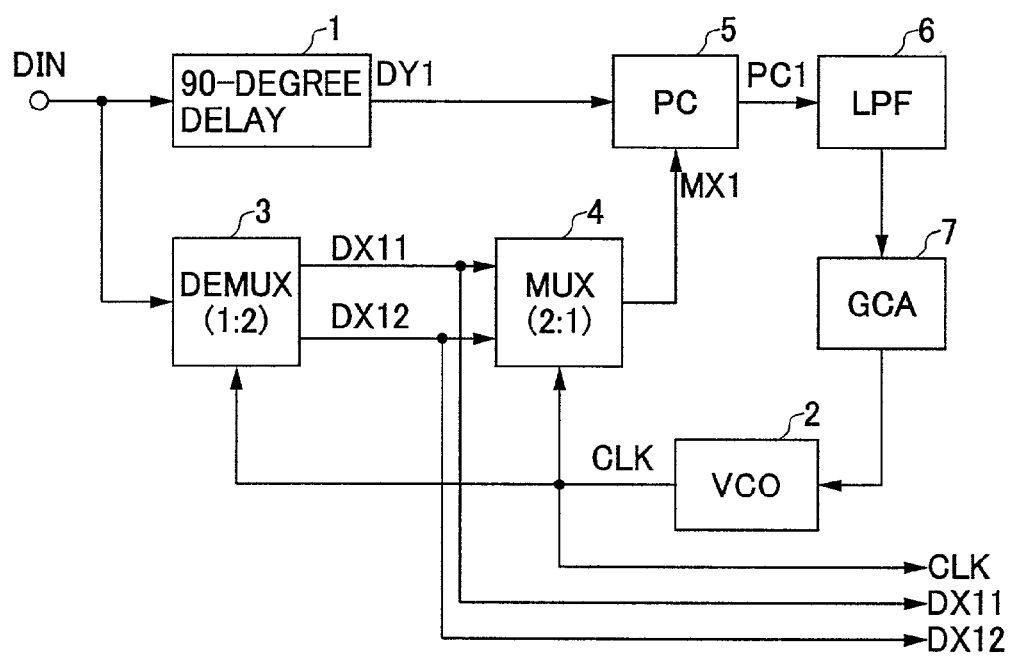
FIG. 5 is a block diagram of the clock/data recovery circuit of a first embodiment of the present invention

FIG. 5 shows a first embodiment of the present invention. In FIG. 5, 1 indicates a 90-degree delay circuit which delays phase of the input data signal DIN by 90-degree, 2 indicates a voltage control oscillator (VCO) which oscillates at a frequency of 1/2 of the bit rate of the input data signal DIN, 3 indicates a demultiplexer (DEMUX) which performs 1:2 demultiplexing operation for the input data signal DIN by using a clock signal CLK output from the voltage control oscillator 2, 4 indicates a multiplexer (MUX) which performs 2:1 multiplexing operation for the output signals DX11, DX12 from the demultiplexer 3 by using the clock signal CLK, 5 indicates an phase comparator (PC) which compares the output signal MX1 of the multiplexer 4 and the output signal DY1 of the 90-degree delay circuit 1, 6 indicates a lowpass filter (LPF) which extracts DC voltage from the output signal PC1 of the phase comparator 5, and 7 indicates a gain control amplifier (GCA) which amplifies the output signal of the lowpass filter 6 and inputs the amplified signal into the voltage control oscillator 2 as a control voltage. The clock signal CLK generated in the voltage control oscillator is a recovery divided clock, and the output signals DX11, DX12 of the demultiplexer 3 is the recovery parallel data.

Figure 6:
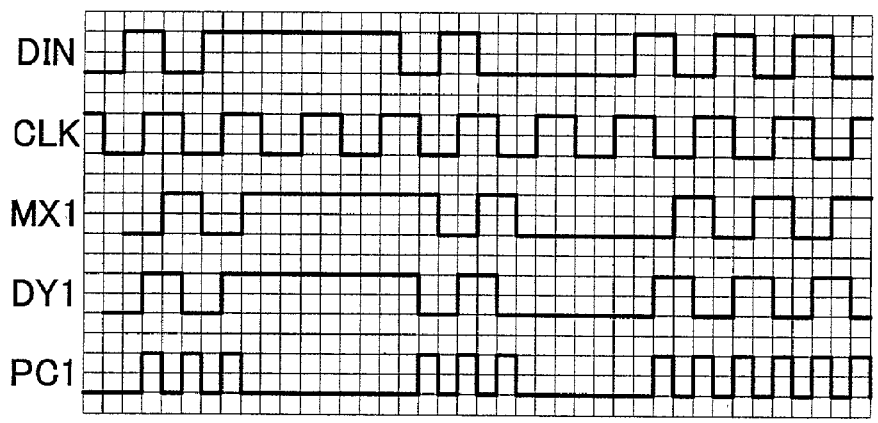
FIG. 6 shows a timing chart of operation of the circuit of FIG. 5.

FIG. 6 shows a timing chart of the operation of this embodiment in the lock status. The demultiplexer 3 demultiplexes the input data signal DIN into two demultiplexed signals, and the multiplexer 4 multiplexes the demultiplexed data signals into the signal MX1. Accordingly, the phase timing of the output signal MX1 of the multiplexer 4 coincides with that of the clock signal CLK. By comparing the phase of the output signal MX1 and the phase of the output signal DY1 of the 90-degree delay circuit 1 by the phase comparator 5, a pulse signal PC1 which has a pulse width according to the phase difference is output from the phase comparator 5, DC voltage of this signal is extracted by the lowpass filter 6, and the DC voltage is amplified by the gain control amplifier 7 and is input to the voltage control oscillator 2 as the control voltage.

The waveform of the output signal of the phase comparator 5 in the timing chart shown in FIG. 6 is for a case that the phase comparator is an EXOR type.

In this embodiment, the data signal MX1 the phase timing of which coincides with the phase timing of the output clock signal CLK of the voltage control oscillator 2 is generated, so that the voltage control oscillator 2 is controlled according to a result of phase comparison between the data signal MX1 and the input data signal DIN. Therefore, the phase of the output signal of the voltage control oscillator 2 is determined uniquely in the lock status, so that low jitter can be realized.

Figure 1:
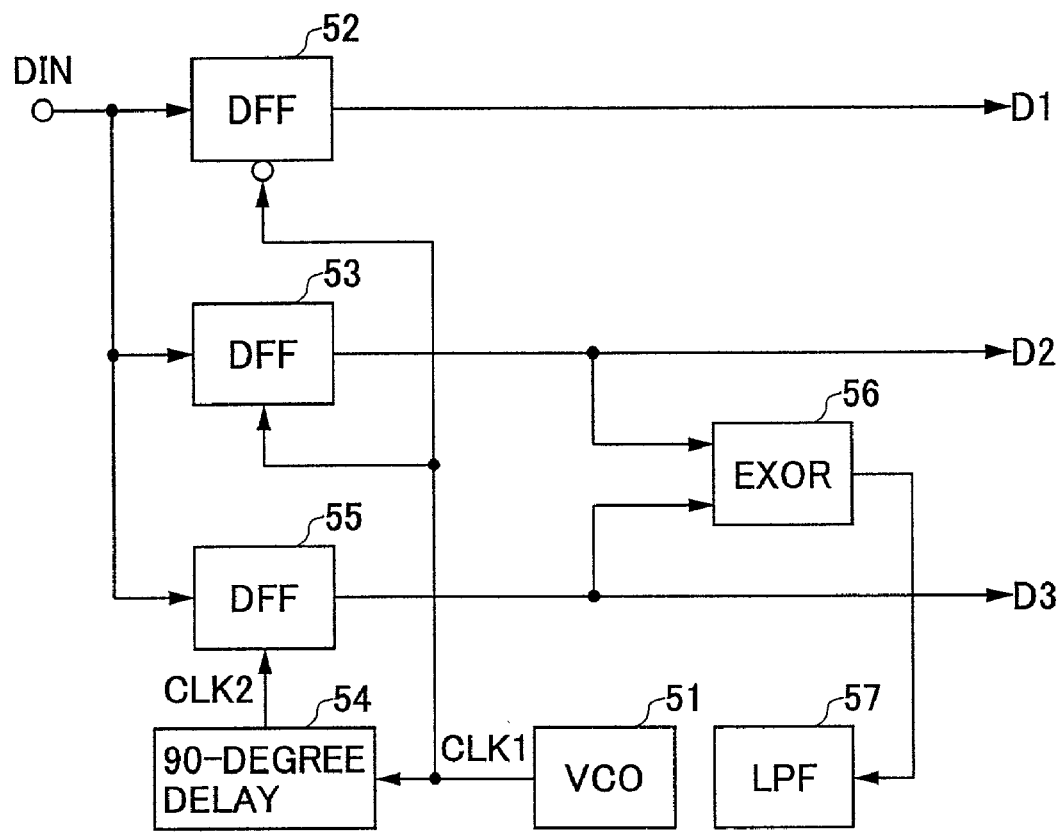
FIG. 1 shows a configuration of a conventional clock/data recovery circuit.
Figure 2:
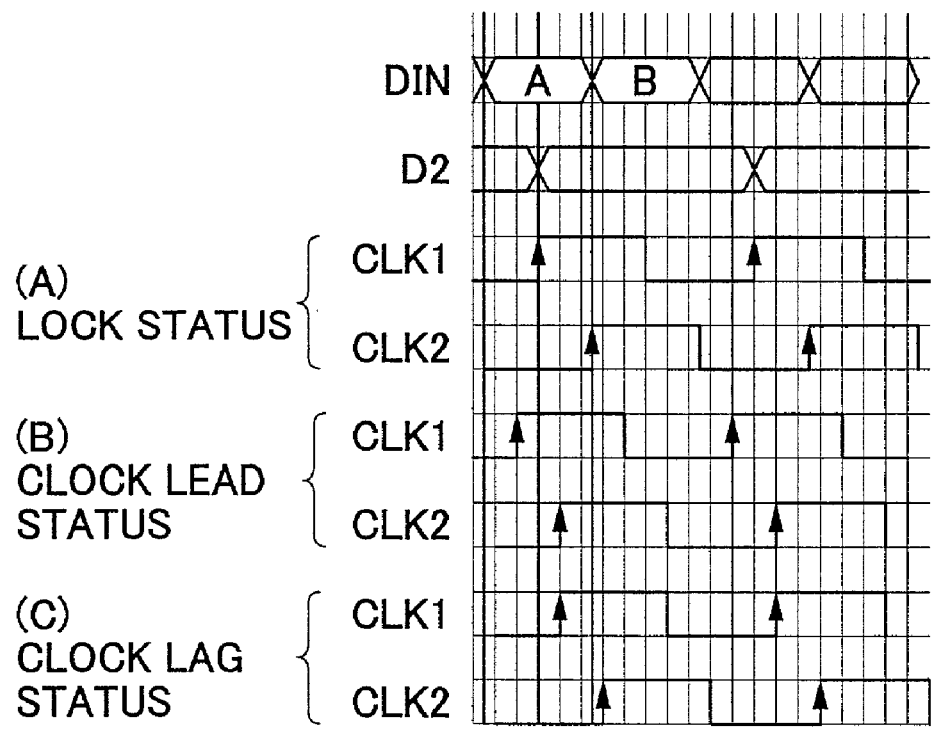
FIG. 2 shows a timing chart of operation of circuit of FIG. 1.
Figure 3:
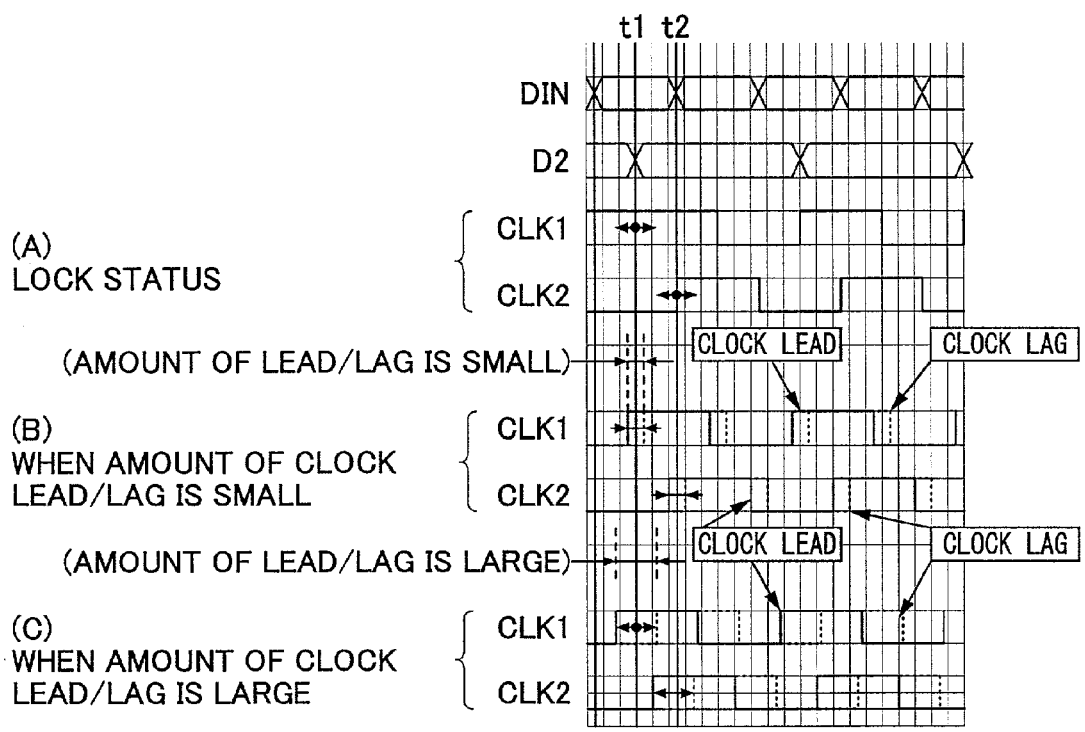
FIG. 3 shows a detailed timing chart of operation of the circuit of FIG. 1.
Figure 7:
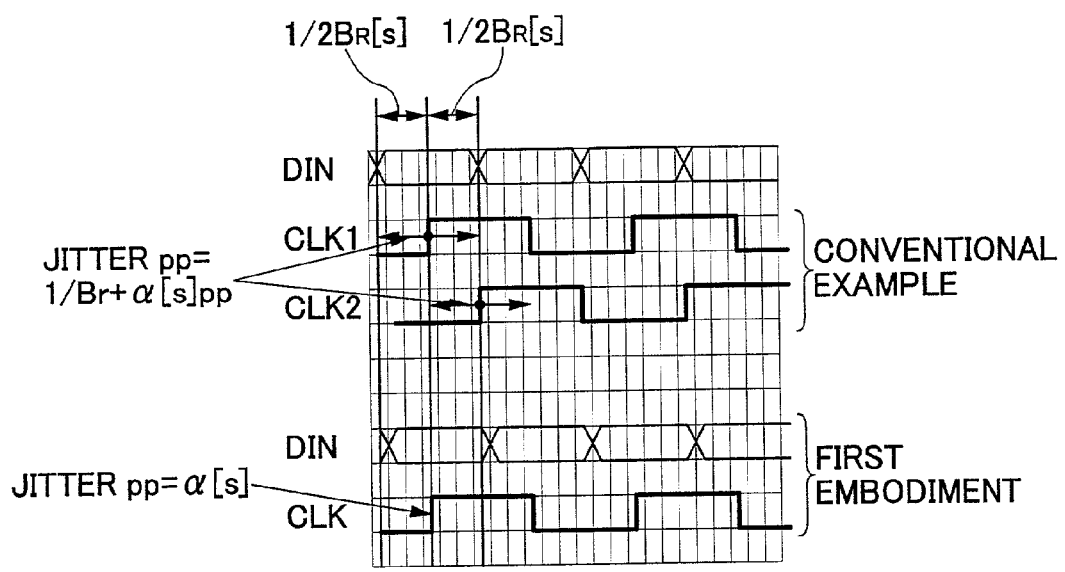
FIG. 7 shows a timing chart of comparison of effects of the circuit of FIG. 5 and an conventional example.

FIG. 7 shows an effect of this embodiment. When bit rate of the input data signal DIN is BR[B/s], the maximum value Jo1 of the jitter in the conventional circuit in FIG. 1 can be represented as $$Jo1=(1/BR)+\alpha[s]pp \qquad (4)$$

wherein α represents jitter [s]pp due to noise generated in the component. On the other hand, jitter JoN in the embodiment shown in FIG. 5 becomes $$JoN=\alpha[s]pp \qquad (5)$$

Thus, the jitter is decreased by 1/BR [s]pp.

Second Embodiment

Figure 8:
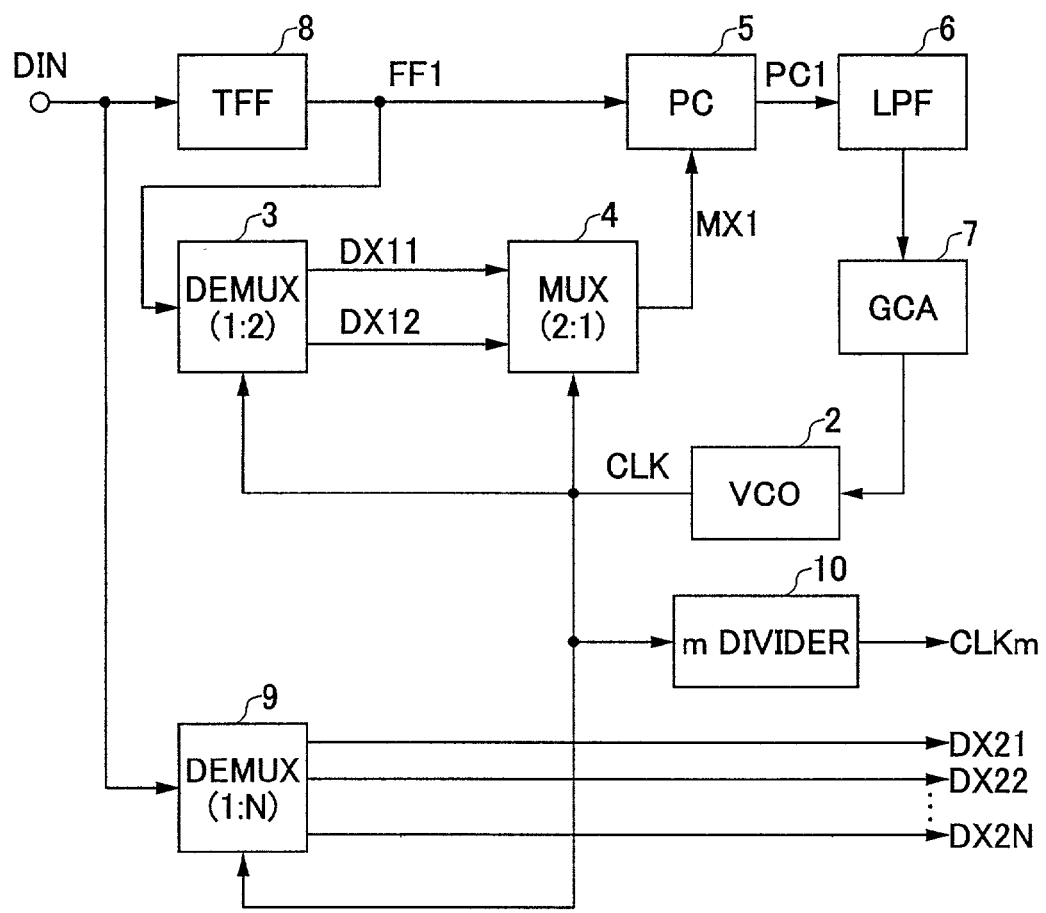
FIG. 8 is a block diagram of the clock/data recovery circuit of a second embodiment of the present invention.

FIG. 8 shows a second embodiment of the present invention. The same numeral is assigned for the same component as that of the first embodiment shown in FIG. 5. In this embodiment, instead of the 90-degree delay circuit 1 shown in FIG. 5, toggle-flip flop circuit (TFF) 8 is connected to input side of the phase comparator 5 as a divider which doubles the minimum pulse width of the output data signal DIN, and the circuit of this embodiment is configured such that the CLK phase timing coincides with that of the output signal FF1 of the toggle-flip flop circuit 8. In addition, a demultiplexer 9 is provided for performing 1:N demultiplexing for the input data signal DIN by using the clock signal CLK, and an m divider 10 which divides the frequency of the clock signal CLK by m (m=N/2) and outputs the divided signal is provided. In this embodiment, the clock signal CLKm output from the m divider 10 is the recovery divided clock, and the output signals DX 21, DX 22, ..., DX2N of the demultiplexer 9 are recovery parallel data.

Figure 9:
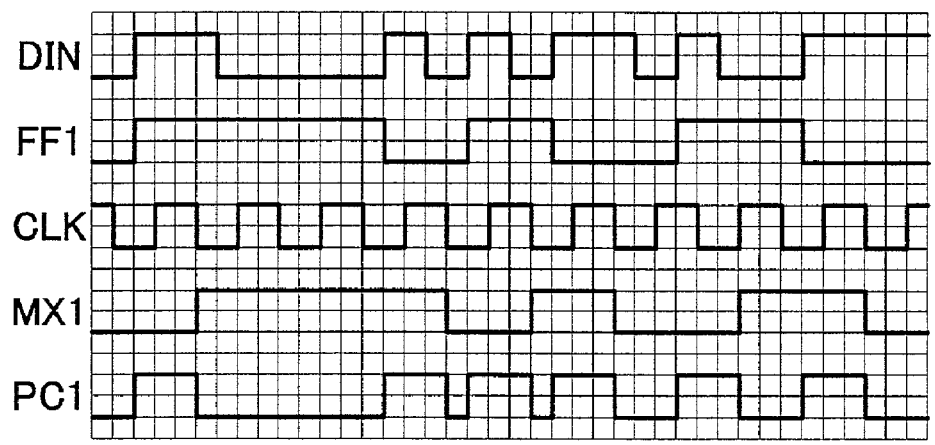
FIG. 9 shows a timing chart of operation of the circuit of FIG. 8.

FIG. 9 shows a timing chart of the operation of this embodiment in a lock status. A demultiplexer 3 which receives the clock signal CLK demultiplexes the output signal FF1 of the toggle-flip flop circuit 8, and the demultiplexed signals are multiplexed by a multiplexer which uses the clock CLK. As a result, the phase timing of the output signal MX1 of the multiplexer 4 coincides with that of the clock signal CLK. Phases of this signal MX1 and the output signal FF1 of the toggle-flip flop circuit 8 are compared by the phase comparator 5. Then, a signal with pulse width according to the phase difference is output from the phase comparator 5, DC voltage of the pulse is extracted by the lowpass filter 6, and the DC voltage of the pulse is amplified by the gain control amplifier 7 and is input to the voltage control oscillator 2.

In this embodiment, since the PLL processing is performed after the minimum pulse width is doubled by the toggle-flip flop 8, operating speed required for the phase comparator becomes 1/2 compared with the first embodiment. Thus, more stable operation can be realized.

Third Embodiment

Figure 10:
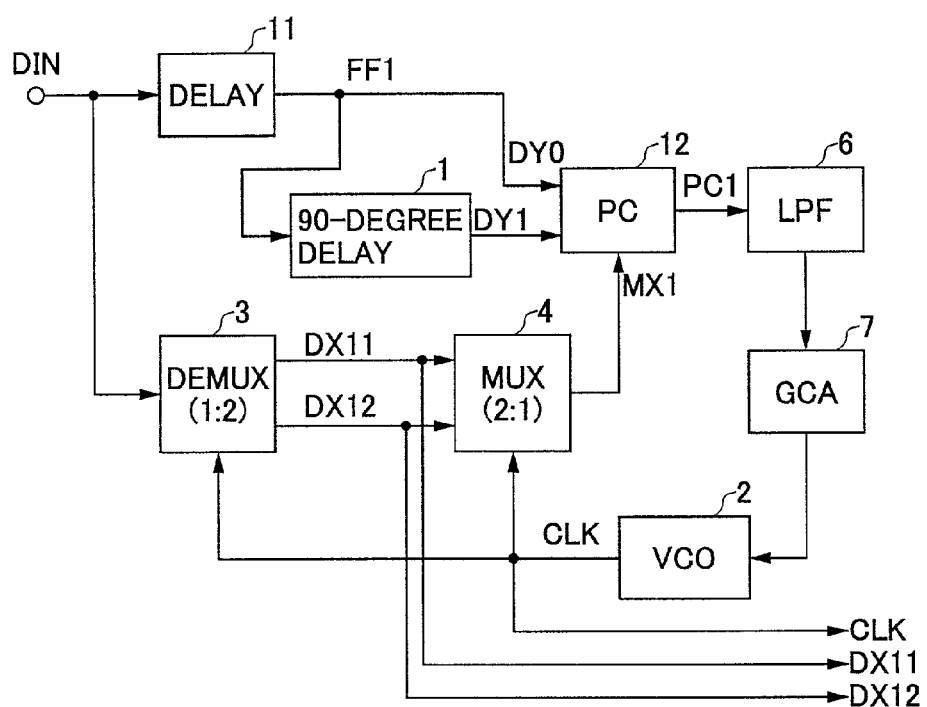
FIG. 10 is a block diagram of the clock/data recovery circuit of a third embodiment of the present invention.

FIG. 10 shows a third embodiment of the present invention. The same numeral is assigned for the same component as that of the first embodiment shown in FIG. 5. Compared with the circuit shown in FIG. 5, a delay circuit 11 for delaying the input data signal DIN is inserted, and the output signal DY0 of the delay circuit 11 is delayed by 90-degree by using the 90-degree delay circuit 1. In addition, a phase comparator 12 which receives the output signal DY0 of the delay circuit 11, the output signal DY1 of the 90-degree delay circuit 1 and the output signal MX1 of the multiplexer 4 is used.

The phase comparator 12 compares phases of the signal DY1 and the multiplexed signal MX1, and compares the phase of a signal of the comparison result and the phase of the signal DY0 (refer to: Japanese laid-open patent application No. 6-252654 for example). According to this phase comparator 12, input-data-pattern dependence of the response can be decreased.

By this configuration, tolerance for the number of consecutive data bits can be improved compared with the first embodiment. Phase change of the output signal MX1 of the multiplexer 4 follows phase change of the clock signal CLK, so that the phase comparator 12 outputs a phase comparison signal having a pulse width according to phase timing difference between the clock signal CLK output from the voltage control oscillator 2 and the input data signal DIN.

Fourth Embodiment

Figure 11:
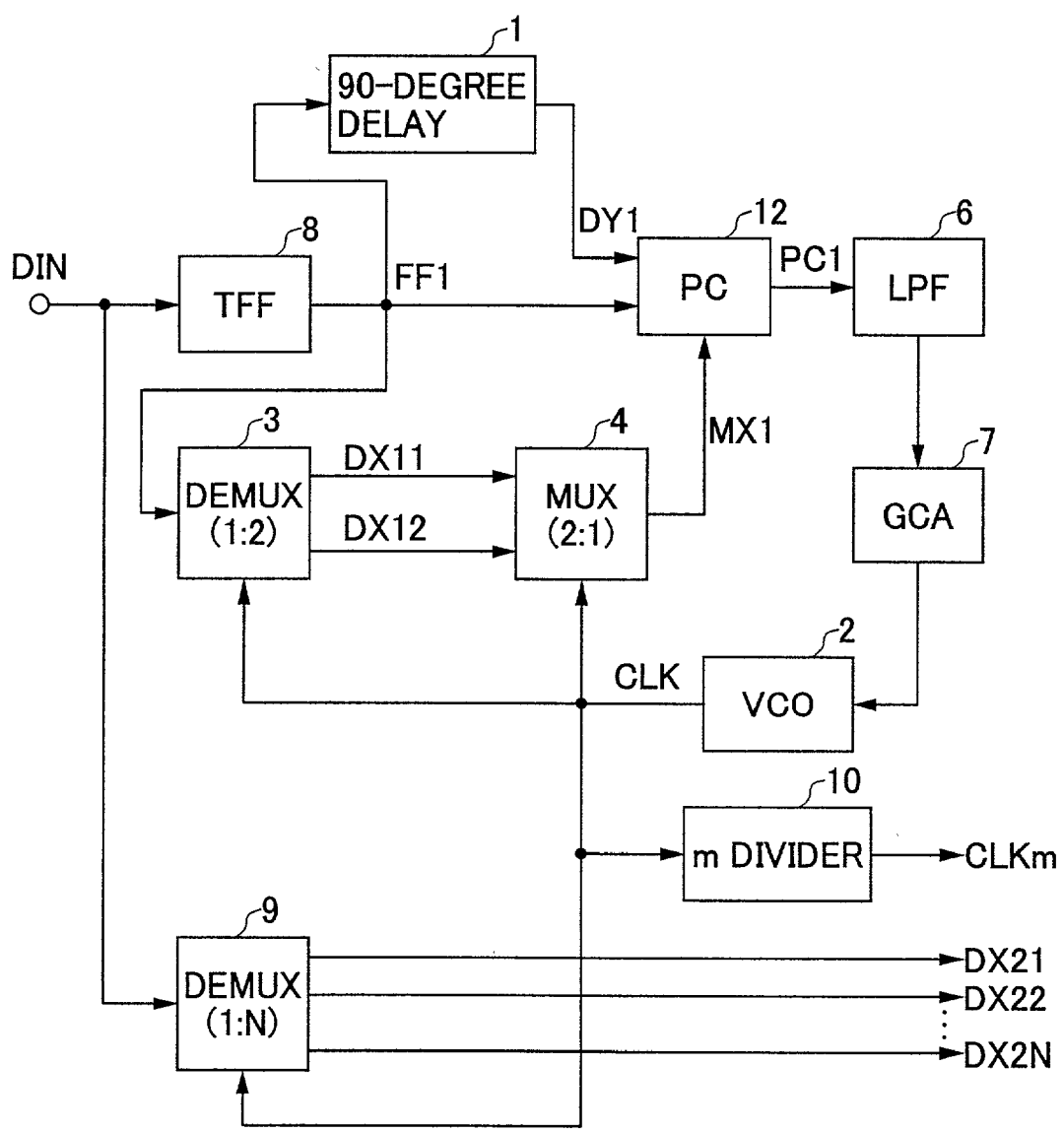
FIG. 11 is a block diagram of the clock/data recovery circuit of a fourth embodiment of the present invention.

FIG. 11 shows a fourth embodiment of the present invention. The same numeral is assigned for the same component as that of the second and third embodiments shown in FIGS. 8 and 10. Compared with the circuit shown in FIG. 8, a 90-degree delay circuit 1 for receiving the output signal FF1 of the toggle-flip flop circuit 8 is inserted, and a phase comparator 12 which receives the output signal DY1 of the 90-degree delay circuit 1, the output signal FF1 of the toggle-flip flop circuit 8 and the output signal MX1 of the multiplexer 4 is provided instead of the phase comparator 5.

By this configuration, tolerance for the number of consecutive data bits can be improved compared with the second embodiment. In addition, compared with the third embodiment, operating speed required for the phase comparator becomes 1/2, so that operating margin becomes larger.

Fifth Embodiment

Figure 12:
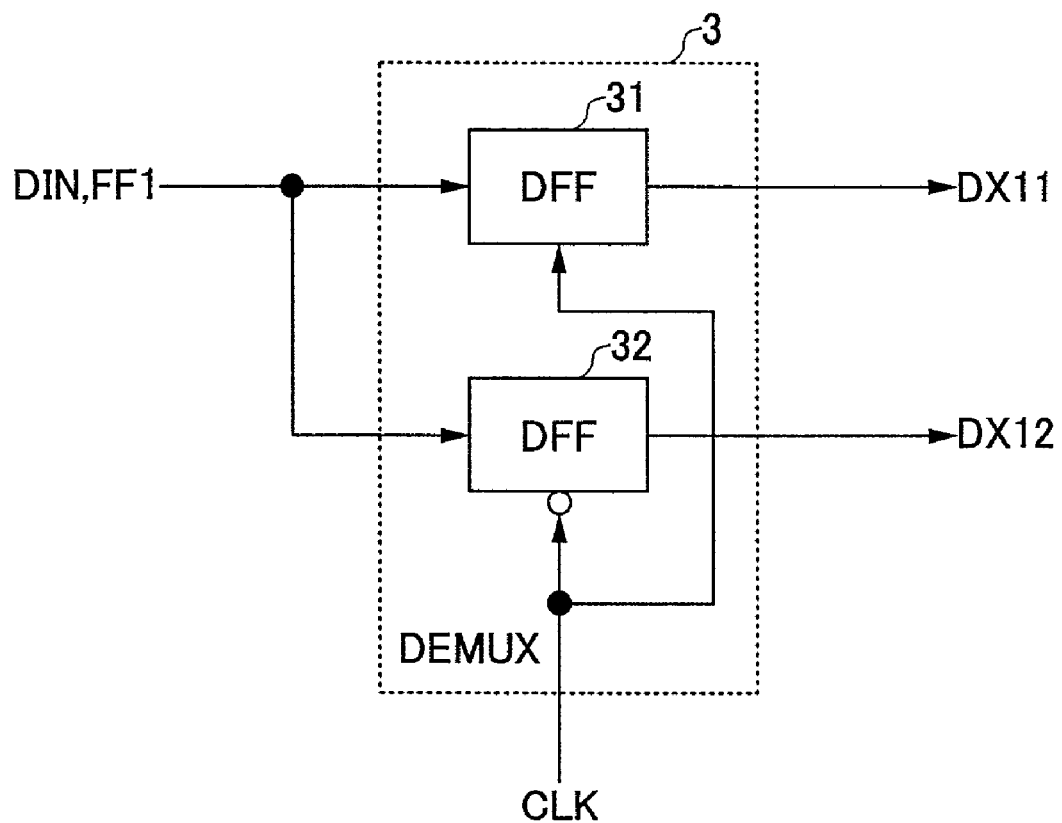
FIG. 12 shows a detailed block diagram of the demultiplexer.
Figure 13:
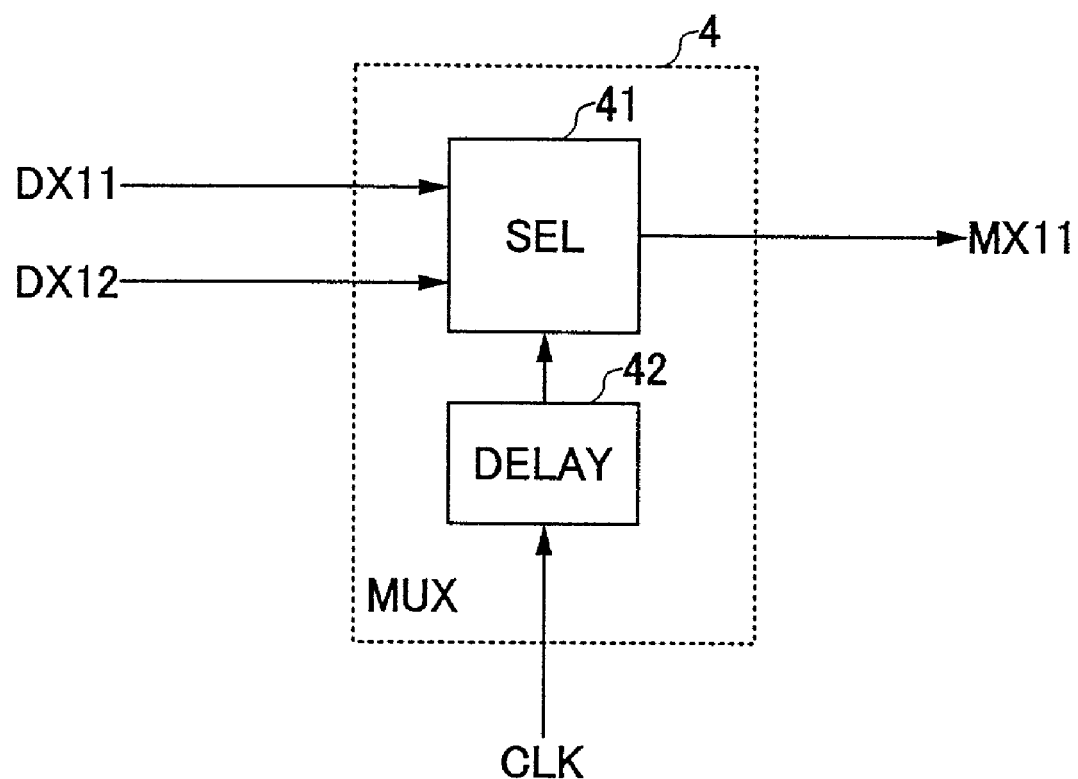
FIG. 13 shows a detailed block diagram of the multiplexer.

FIG. 12 shows a detailed block diagram of the demultiplexer 3. The demultiplexer 3 includes two D-type ms-flip flop circuits 31, 32 which output signals DX11 and DX12 respectively. FIG. 13 is a detailed block diagram of the multiplexer 4. The multiplexer 4 includes a selector 41 and a clock delay circuit 42. The selector 41 is switched by using a signal output from the delay circuit 42 in which the timing of the clock signal CLK is adjusted, so that the signals DX11 and DX12 are selected alternately and outputs MX1. Accordingly, the demultiplexer 3 and the multiplexer 4 can be realized by a simple structure so as to contribute to lowering cost of the clock/data recovery circuit.

In the above-mentioned embodiments, the 90-degree delay circuit 1 shown in FIGS. 5, 10 and 11 are used for timing adjustment, and this circuit is not limited to the 90-degree delay circuit. Any circuit can be used as long as the circuit performs appropriate phase delay.

Sixth Embodiment

The frequency of the oscillation clock CLK of the voltage control oscillator 2 shown in FIGS. 5, 8, 10 and 11 in the above-mentioned embodiments is not limited to 1/2 of bit rate of the input data signal DIN. The frequency can be 1/K (K=2, 3, . . . ) of the bit rate of the input data signal DIN.

At this time, the demultiplexer 3 is configured such that it performs 1:K demultiplexing, and the multiplexer 4 is configured such that it performs K:1 multiplexing. That is, the demultiplexer 3 is configured such that the number of parallel expansion becomes K. In addition, in the second and fourth embodiments, the toggle-flip flop circuit 8 shown in FIGS. 8 and 11 can be replaced by a Q (Q=1, 2, . . . ) divider which divides a frequency of a signal by Q.

When the number of parallel expansion is equal to or more than three, it is necessary to insert a timing adjustment circuit (delay circuit and the like) just before the 90-degree delay circuit in the configuration shown in FIG. 5. Also in the configuration in FIGS. 8 and 11, it is necessary to insert a timing adjustment circuit (delay circuit and the like) just before the divider (TFF).

In the configuration in FIGS. 5, 8, 10 and 11 in the above-mentioned embodiments, the relationship between the frequency of oscillation clock CLK of the voltage control oscillator 2 (VCO) and the number of parallel expansion of the demultiplexer (DEMUX) is not limited to that shown above.

Various cases will be described in the following. In the following description, it is assumed that dividing ratio of the frequency of the oscillation clock CLK to the bit rate (Br[b/s]) of the input data signal is K, that is, it is assumed that the frequency of the oscillation clock CLK is Br/K[Hz], and the number of parallel expansion of the demultiplexer (DEMUX) is M.

In the following, cases will be described in which the cases are K=2, M=K×L (L is a natural number) (first example), K>2 and M=K×L (K is an even number) (second example), K is an odd number equal to or more than three and M=K×L (third example), and K<M (fourth example). Functions of components in a configuration in each example is the same as those of the components in before-mentioned each embodiment. Before-mentioned each embodiment is a case where L=1 in the first example.

Figure 14:
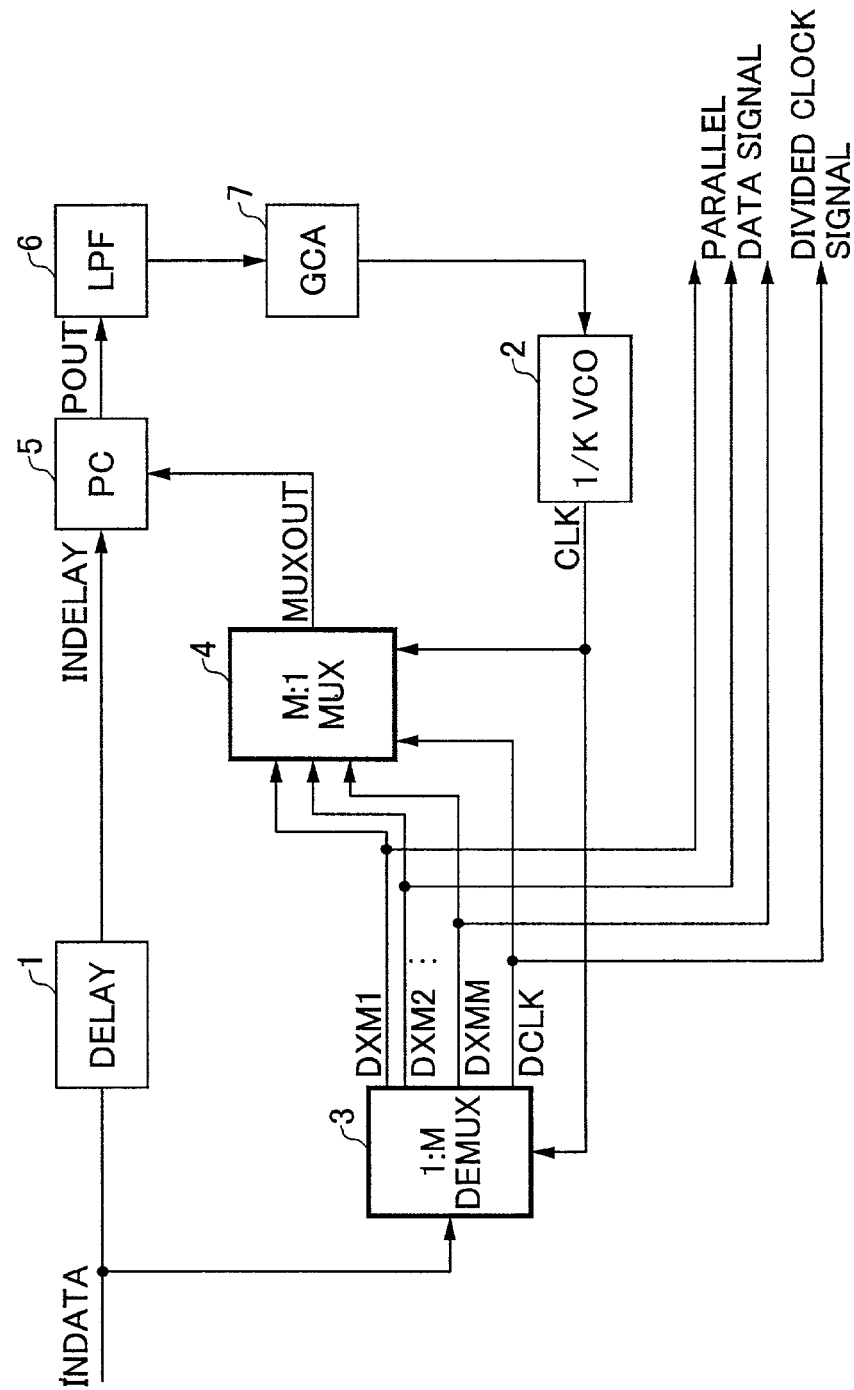
FIG. 14 is a block diagram of the clock/data recovery circuit of a first to third examples in a sixth embodiment of the present invention.

FIG. 14 shows a general configuration in the first to third examples.

In this configuration, the 1:M demultiplexer 3 which receives a VCO oscillation clock signal CLK generates a divided signal DCLK by dividing the clock signal CLK by L. In addition, M parallel data signals are generated by demultiplexing the input signal into M parallel data signals. Then, an M:1 multiplexer 4 multiplexes the M parallel data signals and the multiplexed output signal is input to the phase comparator 5. DCLK is output as a recovery divided clock and the M parallel signals are output as recovery parallel data.

FIRST EXAMPLE

Figure 15:
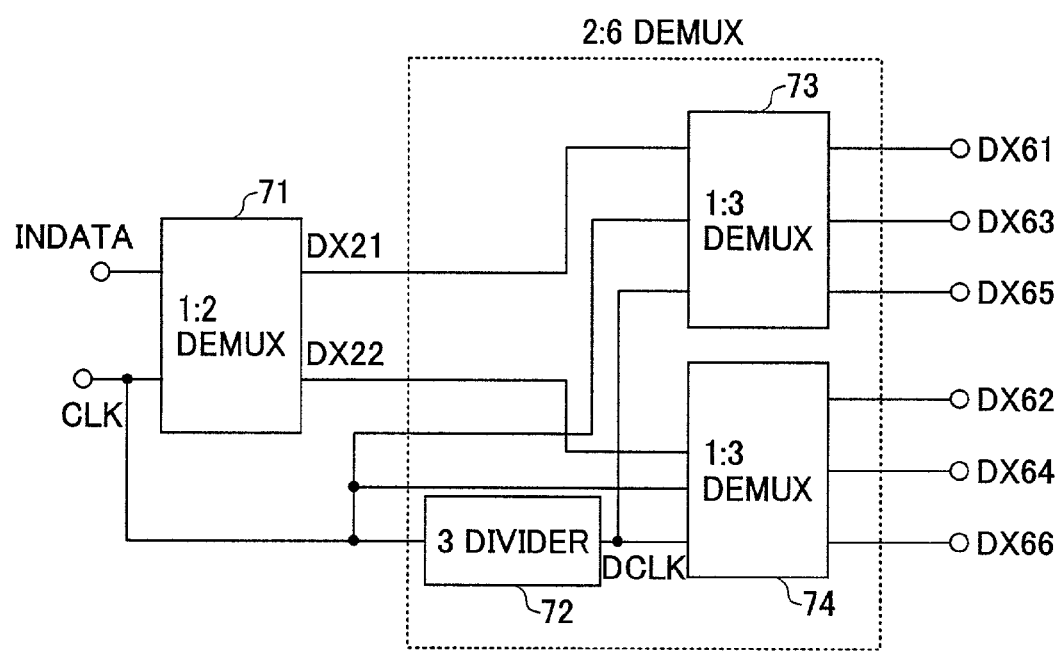
FIG. 15 is a block diagram showing a configuration of an 1:6 demultiplexer.

When K=2 and M=K×L (L is a natural number), as shown in FIG. 15, the 1:M demultiplexer 3 can be configured by using an 1:2 demultiplexer which receives the clock signal CLK, and two 1:L demultiplexers each of which receives the divided signal DCLK which is generated by dividing the clock signal CLK by L by an L divider.

In this configuration, the 1:2 demultiplexer outputs two parallel data signals by demultiplexing the input data signal into two, and each of the two 1:L demultiplexers demultiplexes one of the parallel data signals into L signals. Then, M (=2×L) parallel signals and DCLK are output.

Figure 19:
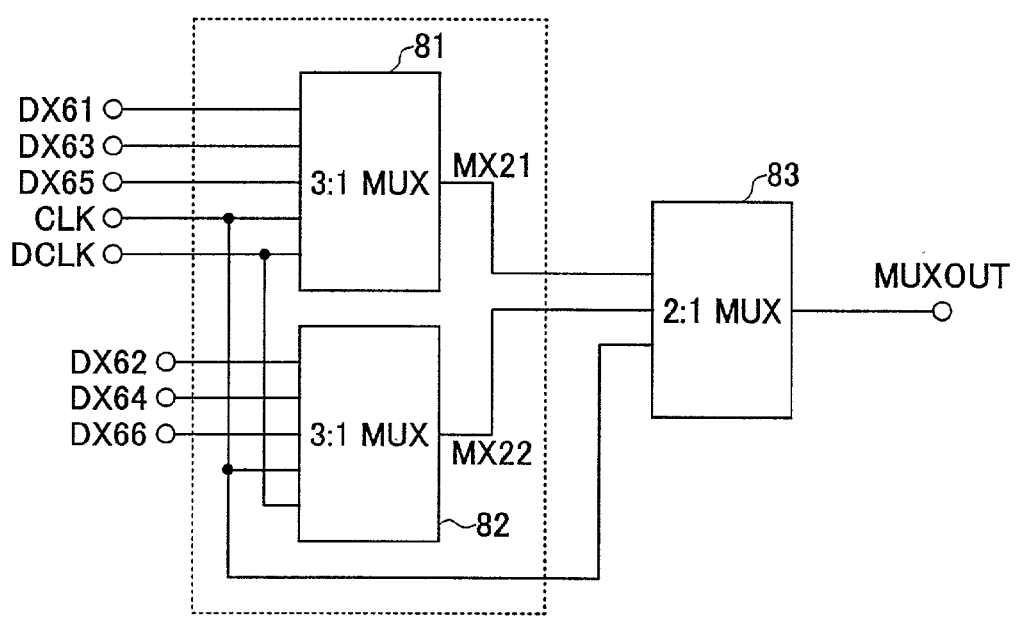
FIG. 19 is a block diagram showing a configuration of a 6:1 multiplexer.

The M:1 multiplexer 4 can be configured by using two L:1 multiplexer each of which receives DCLK and a 2:1 multiplexer which receives CLK as shown in FIG. 19. In this configuration, the two L:1 multiplexers multiplex the M parallel signals into two parallel signals. Then, the 2:1 multiplexer multiplexes the parallel signals into serial data.

A concrete configuration of the demultiplexer when L=3, that is, when K=2 and M=6 is shown in FIG. 15.

As shown in FIG. 15, this 1:6 demultiplexer includes an 1:2 demultiplexer 71, 3 divider 72 (which divides a frequency of a signal by 3) (generally, L divider), and two 1:3 demultiplexers 73 and 74 each of which receives the clock signal DCLK generated by dividing CLK by the 3 divider 72.

In this configuration, the input data signal INDATA is demultiplexed by the 1:2 demultiplexer 71, and the demultiplexed output signals DX21 and DX22 are demultiplexed by the two 1:3 demultiplexer 73 and 74, so that six parallel signals DX61, DX62, DX63, DX64, DX65 and DX66 are output.

Figure 16:
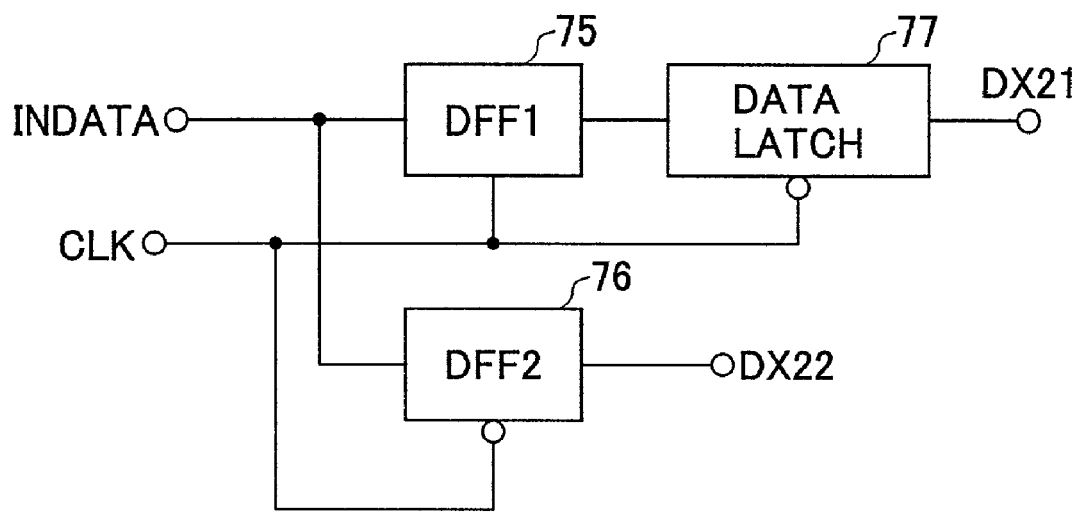
FIG. 16 is a block diagram showing a configuration of an 1:2 demultiplexer.

FIG. 16 shows a block diagram of the 1:2 demultiplexer. In the 1:2 demultiplexer, DFFs 75 and 76 (DFF1, DFF2) which receives CLK and an inverted signal of CLK respectively discriminate the input data signal. Then, output of DFF1 which receives CLK is input into a data latch 77 which uses the inverted signal of CLK, so that phases of the latch output DX21 and output DX22 of the DFF2 which receives the inverted CLK signal are adjusted.

Figure 17:
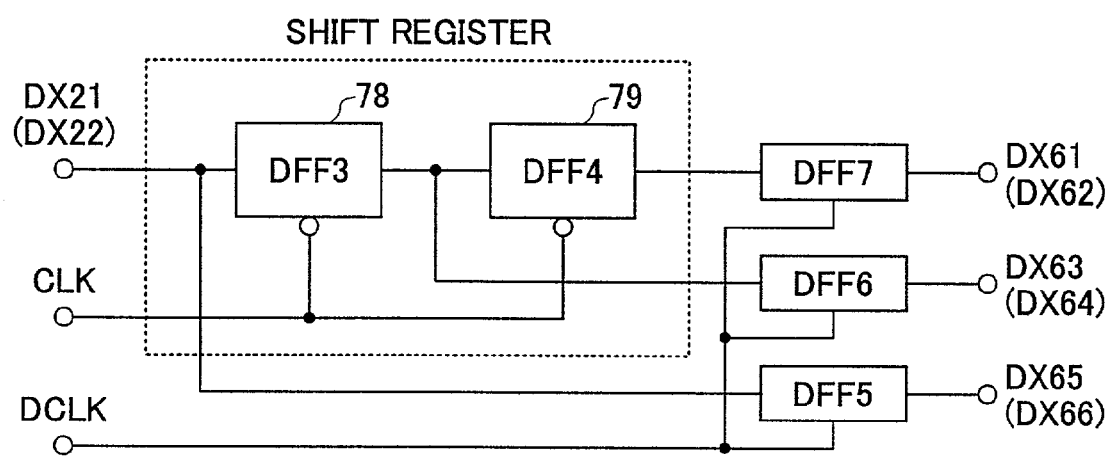
FIG. 17 is a block diagram showing a configuration of an 1:3 demultiplexer.

FIG. 17 shows a block diagram of the 1:3 demultiplexer. DX21 is input to a shift register which consists of two DFFs 78 and 79 (DFFs 3, 4) which receives the inverted CLK signal. Then, DFF5 which receives DCLK discriminates DX21 and outputs a signal DX65, DFF6 which receives DCLK discriminates an output of DFF3 which is in a first stage of the shift register and outputs DX63, and DFF7 which receives DCLK discriminates an output of DFF4 in a second stage of the shift register and outputs a signal DX61. In the same way, DX22 is input to the 1:3 demultiplexer 74, and, DX62, DX64 and DX66 are output, so that parallel signals DX61, DX62, DX63, DX64, DX65 and DX66 are obtained.

Figure 18:
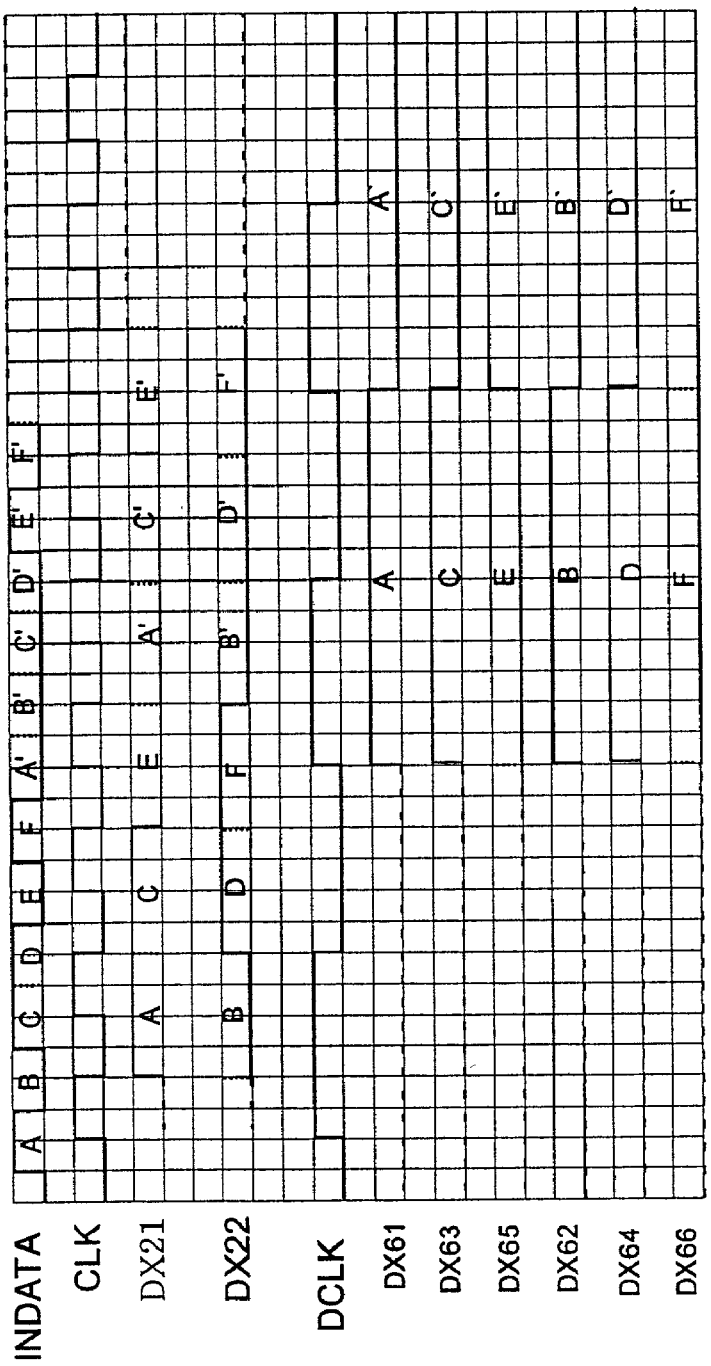
FIG. 18 is a timing chart of the 1:6 demultiplexer.

A timing chart of this 1:6 demultiplexer is shown in FIG. 18. In the examples shown in FIGS. 16 and 17, each DFF and data latch performs rewriting operation at rising edge of the clock.

FIG. 19 shows a block diagram of a 6:1 multiplexer. As show in the figure, the 6:1 multiplexer includes two 3:1 multiplexers 81, 82 each of which receives DCLK, and a 2:1 multiplexer 83.

In this configuration, the signals DX61, DX62, DX63, DX64, DX65 and DX66 are multiplexed by two 3:1 multiplexers 81, 82, and the multiplexed outputs MX21 and MX22 are multiplexed by the 2:1 multiplexer 83 which receives CLK, so that serial data MX61 (MUXOUT) is output.

Figure 20:
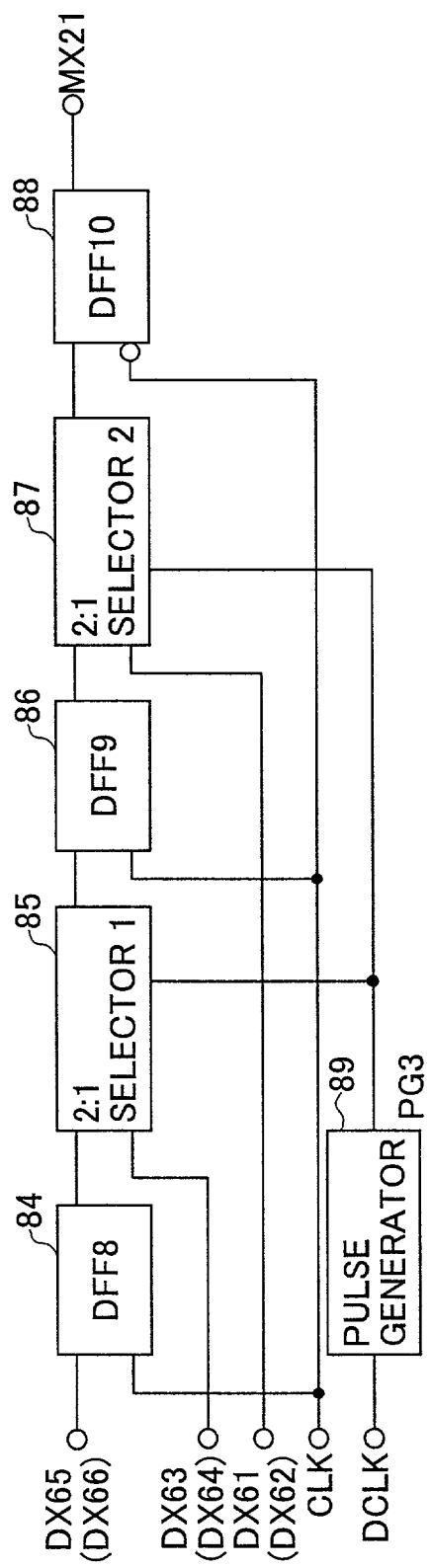
FIG. 20 is a block diagram showing a configuration of a 3:1 multiplexer.

FIG. 20 shows a block diagram of the 3:1 multiplexer 81. In this configuration, DX65 is input to DFF8 (84) which receives CLK, and the output of DFF8 and DX63 are input to a 2:1 selector 1 (85) which receives an output PG3 of a pulse generator 89 which outputs the signal with pulse width of CLK at DCLK period. In addition, the output of the 2:1 selector 1 is input to DFF9 (86) which receives DCLK, the output of DFF9 and DX1 are input to a 2:1 selector 2 (87) which receives PG3 as a switching signal, the output of the 2:1 selector 2 is input to DFF10 (88) which receives an inverted signal of CLk. Then, DX61, DX63 and DX65 are multiplexed, so that MX21 is output. In the same way, DX62, DX64 and DX66 are multiplexed by the 3:1 multiplexer 82 and MX22 is output as a multiplexed output.

Figure 21:
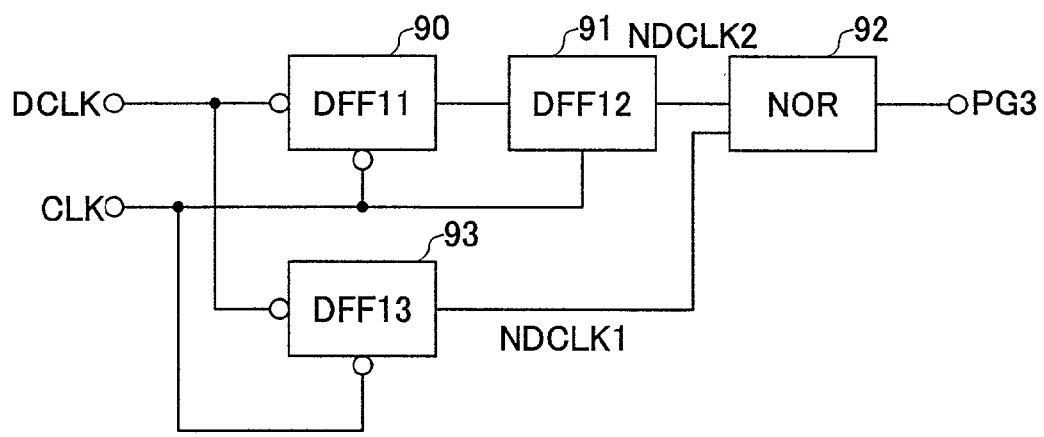
FIG. 21 shows a block diagram of a pulse generator.

FIG. 21 shows a block diagram of the pulse generator 89. In this configuration, an inverted signal of DCLK is input to DFF11 (90) which receives an inverted signal of CLK as a clock signal, and the output is input to DFF12 (91) which receives CLK as a clock signal. Then, the output signal of DFF12 and an output signal of DFF13 are input to an NOR circuit 92 in which the output signal of DFF12 is a signal generated by delaying the inverted signal of DCLK by one period of CLK, and the output of DFF 13 is a signal generated by delaying an opposite signal of DCLK by a half period of CLK. The NOR circuit 92 outputs the signal PG3 of the pulse generator which outputs the signal with pulse width of CLK at DCLK period.

Figure 22:
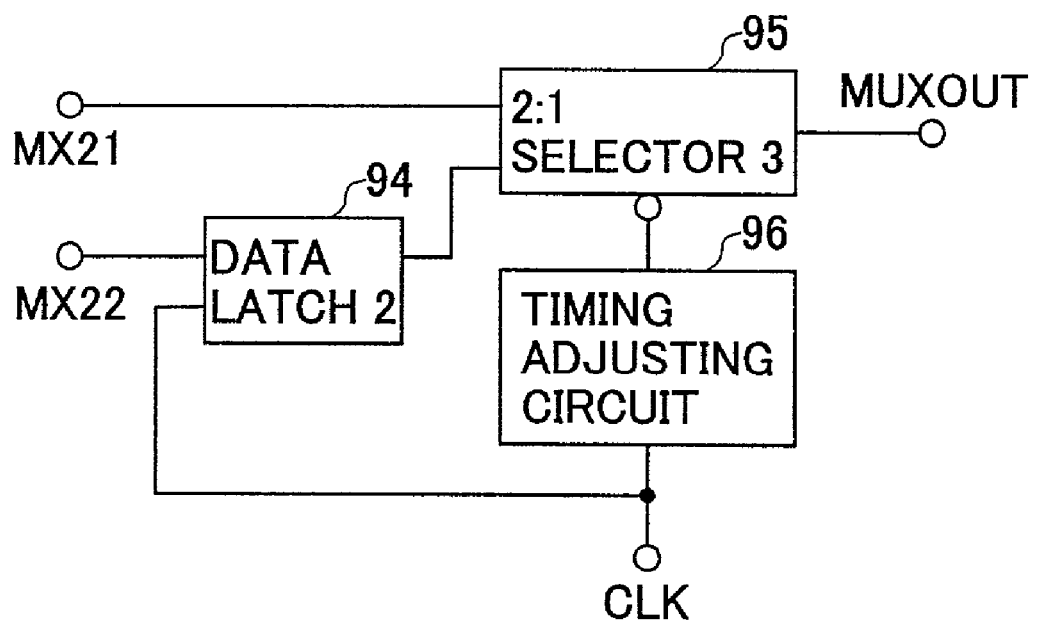
FIG. 22 is a block diagram showing a configuration of a 2:1 multiplexer.

FIG. 22 shows a block diagram of a 2:1 multiplexer. In this configuration, MX22 is input to a data latch 2 (94) which receives CLK, so that the phase of MX22 is shifted by a half period of CLK. Then, the data latch output signal and MX21 are input to a 2:1 selector 3 (95) which receives an inverted signal of a signal output from a timing adjustment circuit 96 in which timing of CLK is adjusted as a switching signal. Then, MX21 and the output of the data latch are output alternately, so that a serial data signal MUXOUT in which MX21 and MX22 are multiplexed is output.

Figure 23:
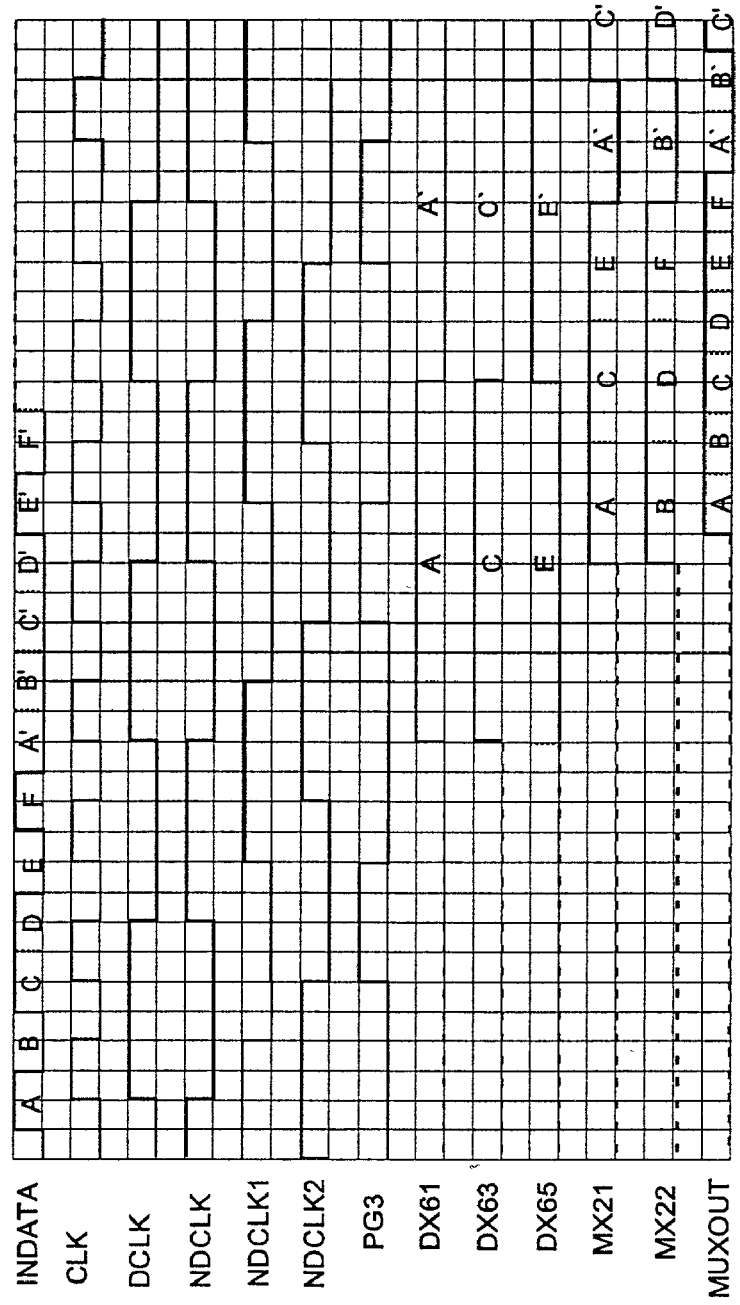
FIG. 23 is a timing chart of a 6:1 multiplexer.

A timing chart of the 6:1 multiplexer is shown in FIG. 23. In the above-mentioned examples, DFF8, 9, 10, 11, 12 and 13 perform rewriting operation at rising edge of the clock signal, and the 2:1 selectors 1 and 2 select DX63 and DX61 when PG 3 is 1 (high), and select DFF output when PG3 is 0 (low). In addition, the switching signal of the 2:1 selector 3 is a signal in which CLK is delayed, and the 2:1 selector 3 selects MX21 when it is 0 (low), selects output of the data latch 2 when it is 1 (high), (In a case when M can be represented as $2^T$ in the first example)

Figure 24:
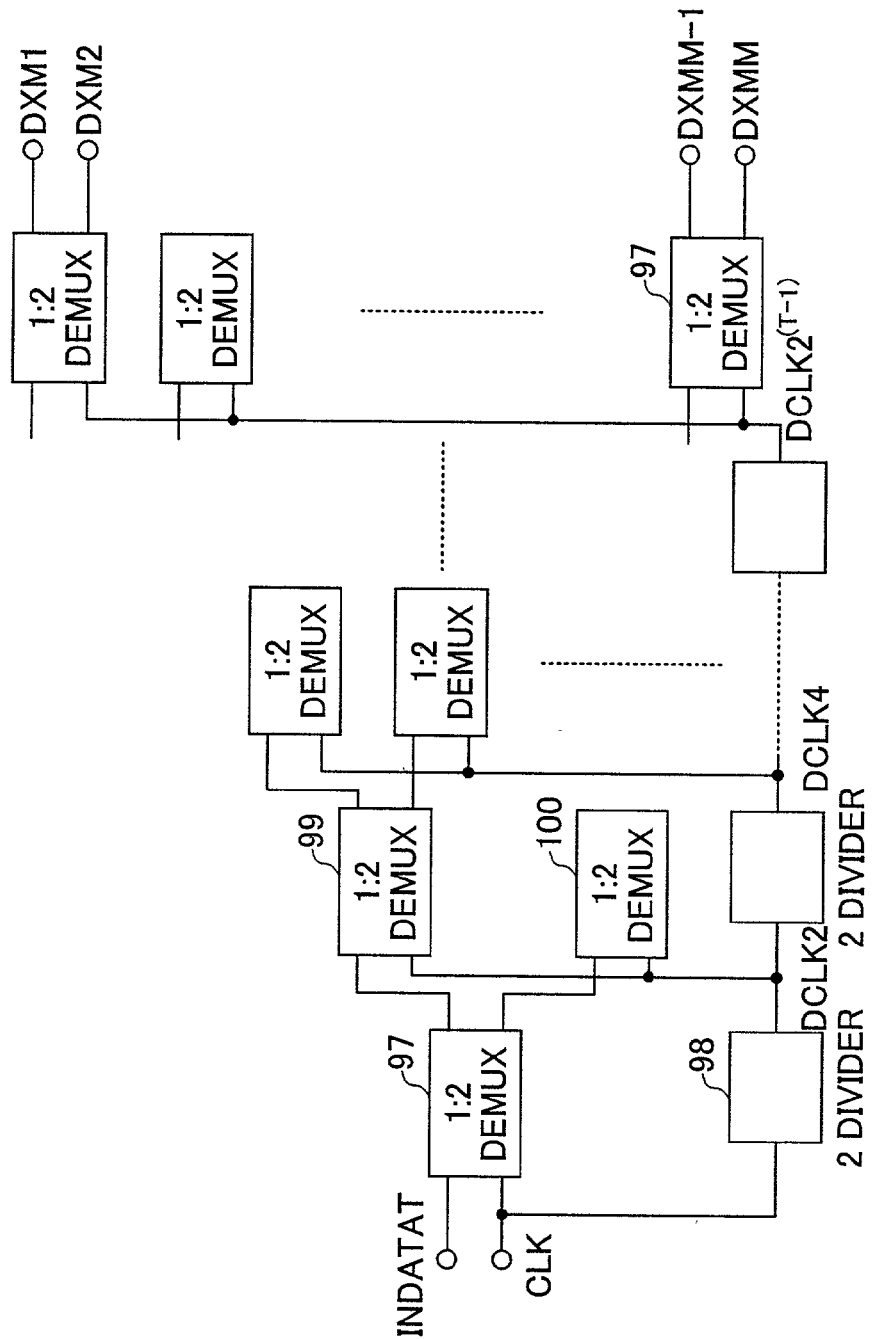
FIG. 24 is a block diagram showing a configuration of an 1:M demultiplexer.

When M can be represented as $2^T$ (T is an integer equal to or larger than 2), the 1:M demultiplexer can be configured as shown in FIG. 24.

In this configuration, an input data signal is demultiplexed by an 1:2 demultiplexer 97 which uses CLK as a clock signal into two parallel data signals. Then, the parallel signals are demultiplexed into four parallel signals by second and third 1:2 demultiplexers 99, 100 which receive a divided signal DCLK2 divided by 2 by a 2 divider 98. In the same way, by repeating demultiplexing parallel data signals by using divided clock signal according to the number of parallel outputs, $1:2^T$ demultiplexing is performed. Accordingly, the input data signal is demultiplexed into $2^T$ parallel data signals.

Figure 25:
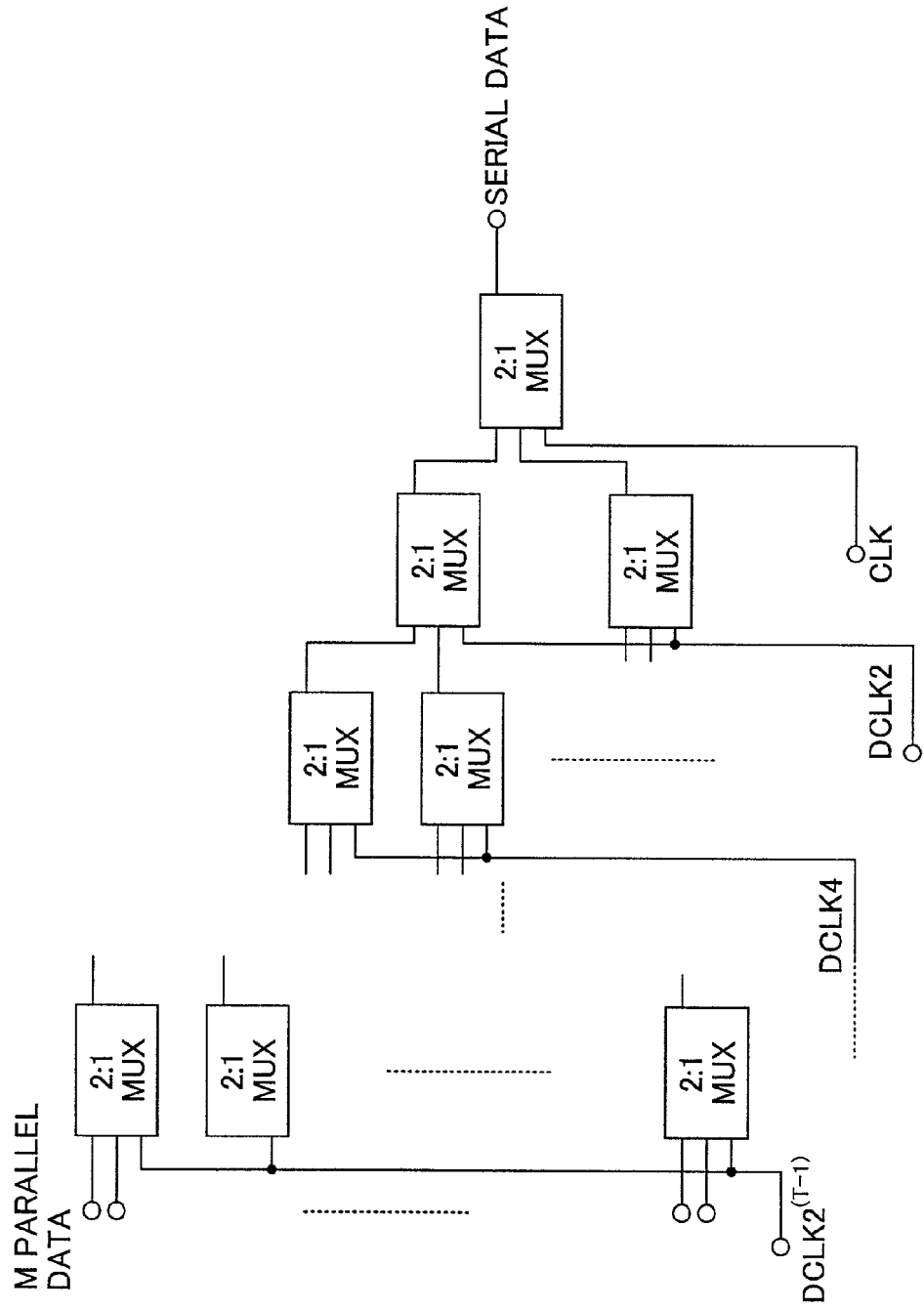
FIG. 25 is a block diagram showing a configuration of an M:1 multiplexer.

When M can be represented as $2^T$, the configuration of the M:1 multiplexer 4 is as shown in FIG. 25. In this configuration, the demultiplexed signals are multiplexed into M/2 parallel data signals by M/2 2:1 multiplexers each of which receives $DCLK2^{T-1}$ generated by dividing CLK by L as a clock signal. Then, in the same way, the multiplexed data signals are multiplexed repeatedly by using 2:1 multiplexers which use a divided clock by using parallel signal input number. As a result, a serial data signal is output. $DCLK2^{T-1}$ is output as a recovery divided clock and M parallel signals are output as recovery parallel data.

SECOND EXAMPLE

When K>2 an K is an even number and M=K×L (L is a natural number), that is, when K=2×J (J is an integer equal to or larger than 2) and M=K×L (L is a natural number), the 1:M demultiplexer can be configured by an 1:K demultiplexer and K−1:L demultiplexers. In this configuration, K−1 signals each having different phase of (180×P)/K (P=1, 2, . . . , K−1) degree with respect to the VCO oscillation signal CLK are generated. Then, the 1:K demultiplexer demultiplexes input data signal into K parallel data signals by using the generated signal and CLK. In addition, CLK is divided by M/K(=L) by using a divider and each of the parallel signals is 1:L demultiplexed by using the divided signal DCLK and CLK (therefore, K1:L demultiplexers are necessary), so that M parallel signals are output for the input data signal.

In this case, the M:1 multiplexer can be configured by K L:1 multiplexers and a K:1 multiplexer. The L:1 multiplexers multiplexe M parallel signals into K parallel signals by using DCLK and CLK, and the K parallel signals are multiplexed into a serial data signal by using CLK and MCLK generated by multiplying CLK by J by using a multiplier.

In the above configuration, the VCO may generate the K−1 signals each having different phase of (180×P)/K(P=1, 2, . . . , K−1) degree.

By using the signal MCLK generated by multiplying CLK by J in multiplier and the signal DCLK generated by dividing CLK by M/K(=J), the configuration can be the same as that of the first embodiment.

THIRD EXAMPLE

Also when K is an odd number equal to or larger than 3, and M=K×L (L is an integer equal to or larger than 1), the same configuration as that of the second embodiment can be used.

FOURTH EXAMPLE

Figure 26:
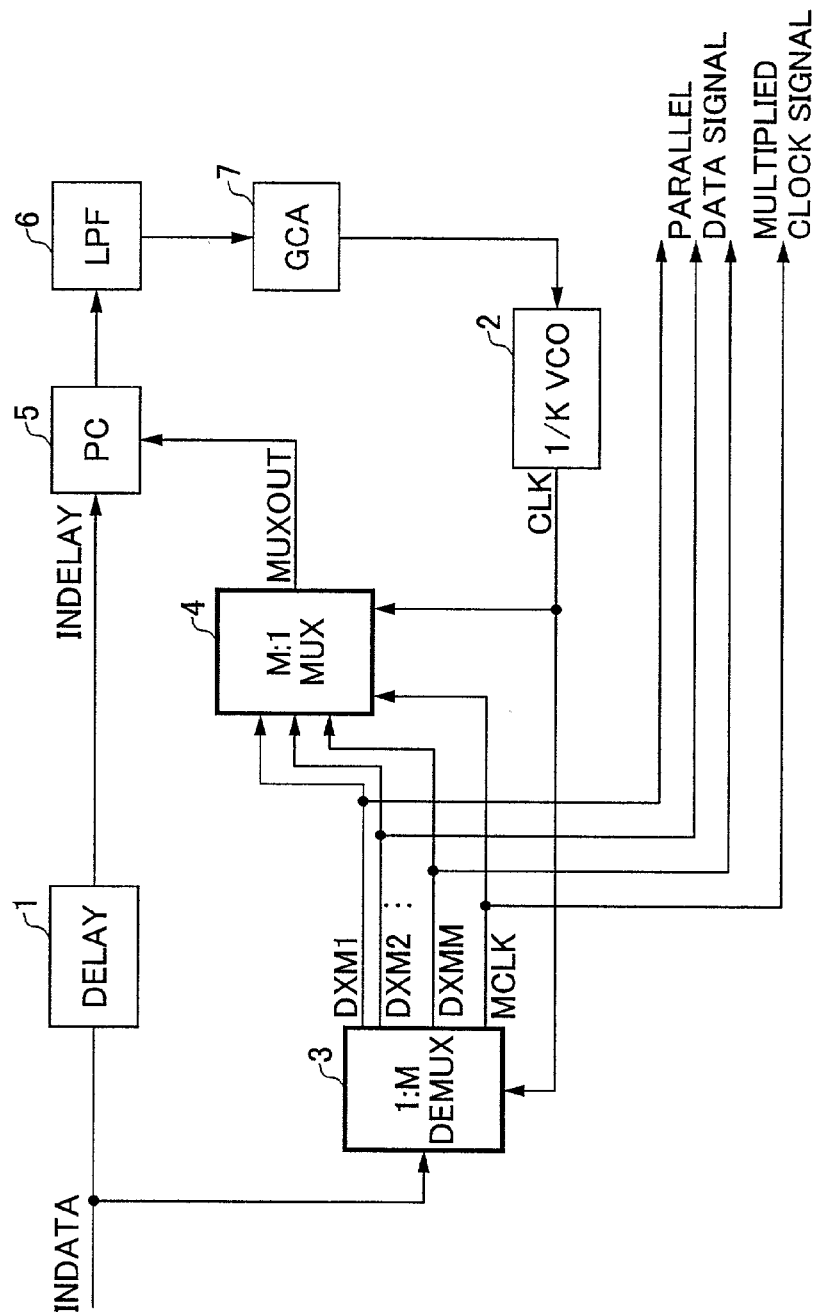
FIG. 26 is a block diagram of the clock/data recovery circuit of a first to third examples in a sixth embodiment of the present invention.

When K>M (K=S×M in which S is a natural number and M is any number), the circuit can be configured as shown in FIG. 26. This configuration can be regarded as a case K=M in the first to third cases by multiplying CLK by S by a multiplier in the 1:M demultiplexer 3 and generating the multiplied signal (MCLK). In this configuration, a divided clock signal generated by multiplying CLK by S and M parallel data signals are output.

Seventh Embodiment

The division number of the divider and the division number of VCO can take various relationship. In the following description, it is assumed that the division number of the divider is Q, the dividing ratio of the oscillation frequency of VCO to the bit rate of the input data signal is K and the number of parallel expansion of the second demultiplexer (DEMUX 9) is N.

First, a case where Q=2, K=2 is available as shown in the second and fourth embodiment.

Other than the case where Q=2, K=2, combinations of K and Q can be taken such that K and Q satisfies a relationship of the first to fourth examples in the sixth embodiment. When divided signal or multiplied signal according to parallel number N is not generated in the second DEMUX, the circuit needs to be configured such that divided signal, multiplied signal according to parallel number N and N parallel data signals are output by using N/K divider (N>=K) and K/N multiplier (K>N).

Figure 27:
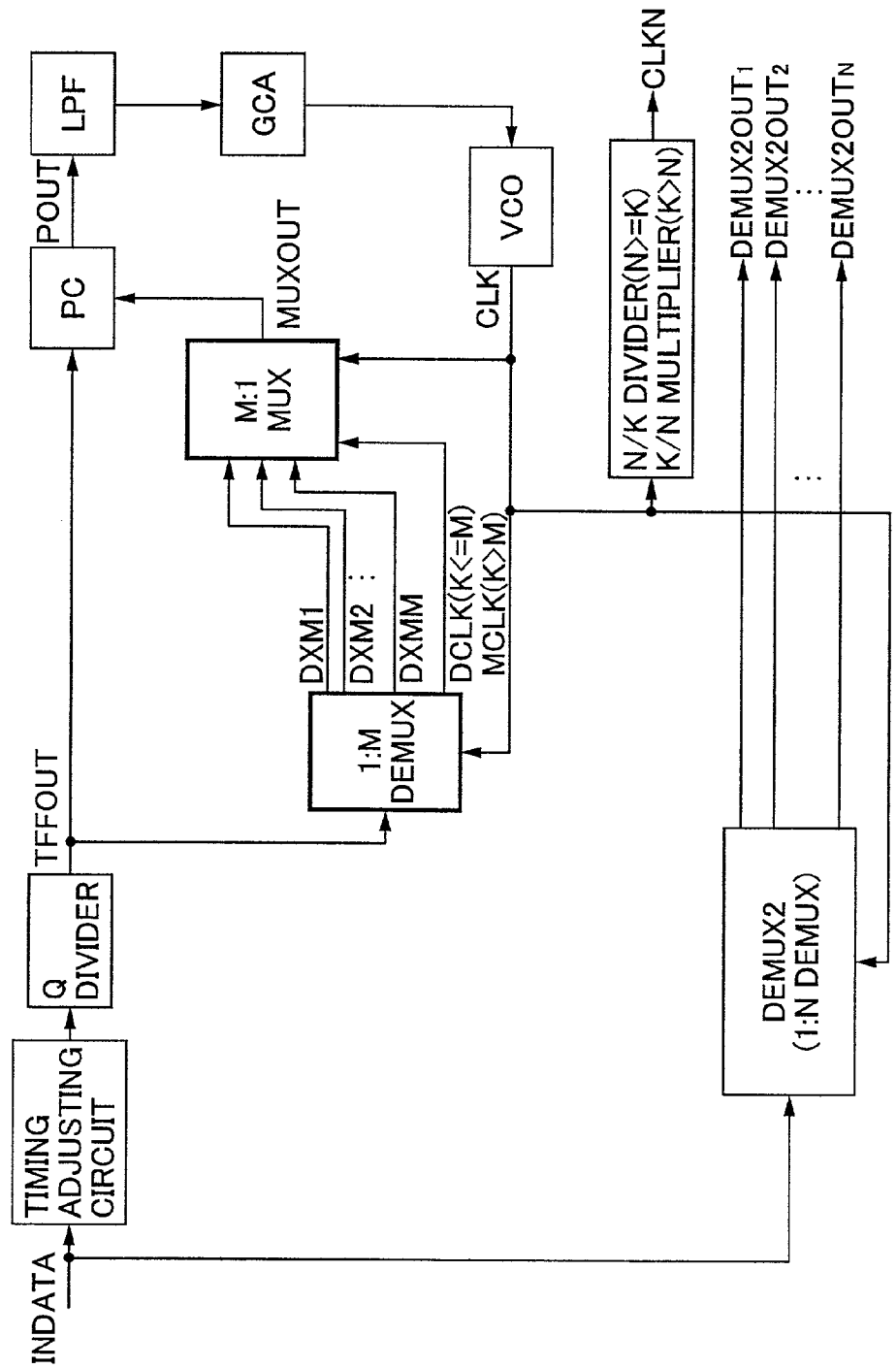
FIG. 27 is a block diagram of a configuration in which the configuration of FIG. 8 is generalized.
Figure 28:
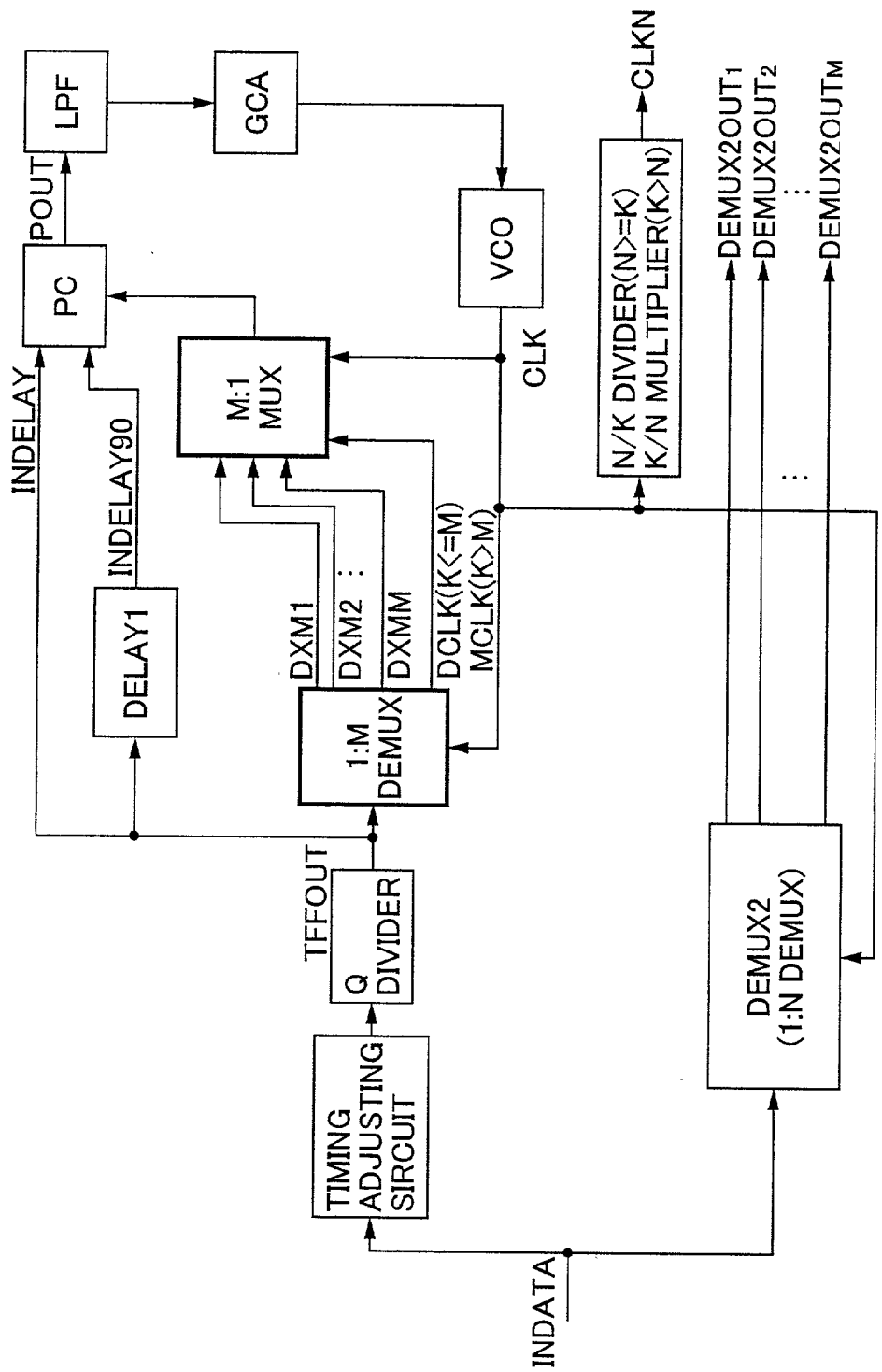
FIG. 28 is a block diagram of a configuration in which the configuration of FIG. 11 is generalized.

From this viewpoint, a configuration which generalizes the configuration of FIG. 8 is shown in FIG. 27, and a configuration which generalizes the configuration of FIG. 11 is shown in FIG. 28.

As described above, according to the present invention described by using above embodiments, multiplexing/demultiplexing is performed on the input data signal to convert the signal into a data signal in which the phase is corresponds with that of an output clock signal of the voltage control oscillator. Then, by comparing phases of the data signal and the input data signal, phase comparison output signal according to phase difference between the input data signal and the data signal can be output even by using the voltage control oscillator the frequency of which is 1/k of that of the conventional voltage control oscillator. Thus, low jitter can be realized such that the feedback voltage to the voltage control oscillator can be proportional to the difference between the value of two times of the free-running frequency of the voltage control oscillator and the value of bit rate of the input data.

Eighth Embodiment

Figure 29:
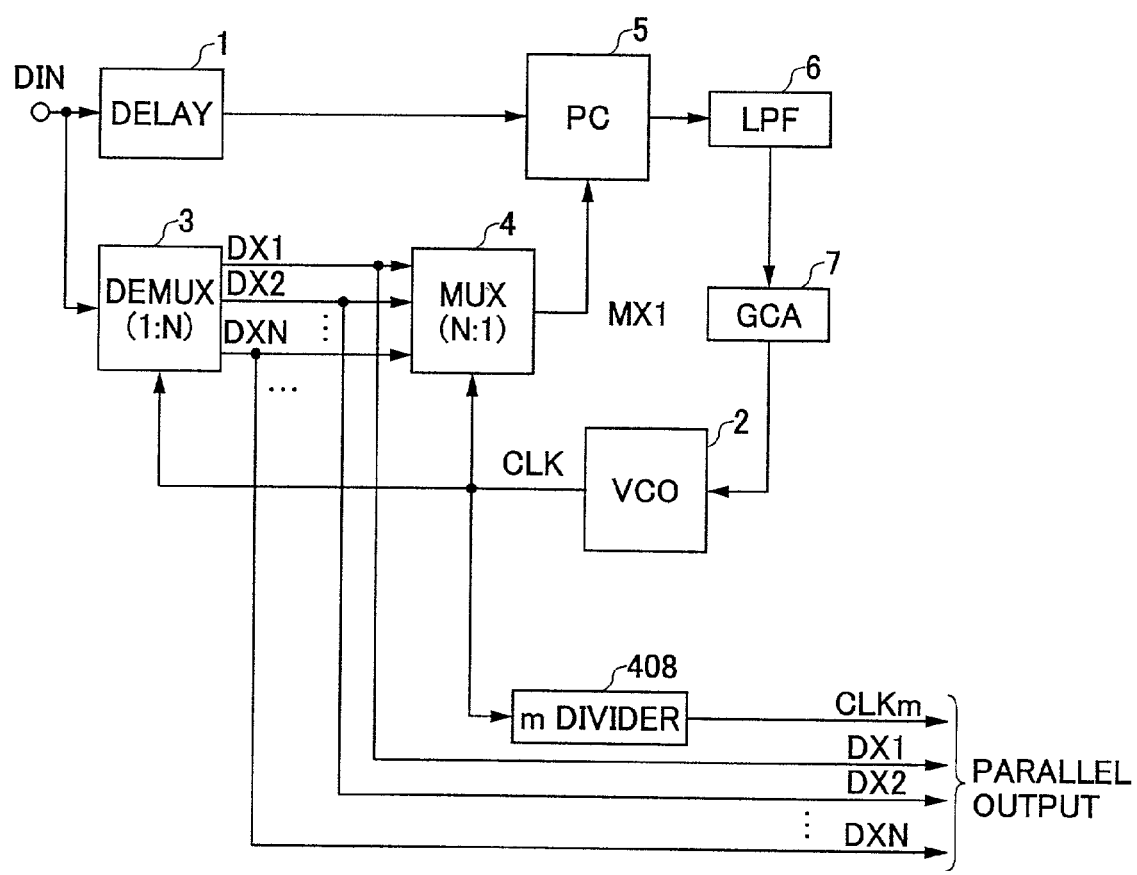
FIG. 29 is a block diagram of a clock/data recovery circuit.

Although according to the above-mentioned each embodiment, there is an effect that low jitter can be realized, there is a following problem. The problem will be described by using FIG. 29. FIG. 29 shows an example of a clock/data recovery circuit (CDR circuit) in the embodiments which have been described.

In FIG. 29, 1 indicates a delay circuit which delays the input data signal DIN for timing adjustment, 2 indicates a voltage control oscillator (VCO) which oscillates at a frequency of 1/2 of the bit rate of the input data signal DIN, 3 indicates a demultiplexer (DEMUX) which performs 1:N (N>2) demultiplexing operation for the input data signal DIN by using a clock signal CLK output from the voltage control oscillator 2, 4 indicates a multiplexer (MUX) which performs N:1 multiplexing operation for the N output signals DX1, DX2, . . . , DXN from the demultiplexer 3 by using the clock signal CLK as a clock signal, 5 indicates an phase comparator (PC) which compares the output signal MX1 of the multiplexer 4 and the output signal of the delay circuit 1, 6 indicates a lowpass filter (LPF) which extracts DC voltage from the output signal of the phase comparator 5, and 7 indicates a gain control amplifier (GCA) which amplifies the output signal of the lowpass filter 6 and inputs the amplified signal into the voltage control oscillator 2 as a control voltage. 408 indicates an m divider which divides the clock signal CLK by m (m=N/2). The output signal of the m divider 408 is a recovery divided clock CLKM. And the output signals DX1, DX2, . . . , DXN of the demultiplexer 3 are data signals which are recovery parallel data.

As described before, the demultiplexer 3 demultiplexes the input data signal DIN into N, and the multiplexer 4 multiplexes the N demultiplexed data signals into MX1. Accordingly, the phase timing of the output signal MX1 of the multiplexer 4 coincides with that of the clock signal CLK. By comparing the phase of the output signal MX1 and the phase of the output signal of the delay circuit 1 by the phase comparator 5, a pulse signal which has a time width according to the phase difference is output from the phase comparator 5, DC voltage of this signal is extracted by the lowpass filter 6, and the DC voltage is amplified by the gain control amplifier 7 and is input to the voltage control oscillator 2 as the control voltage.

According to this configuration, low jitter can be realized and the performance of the clock/data recovery circuit can be enhanced. However, signals which can be output from the clock/data recovery circuit are only the signal MX1, N parallel signals DX1, DX2, . . . , DXN which are 1:N demultiplexed, and a clock signal CLKm having a frequency of equal to or less than 1/2 of the bit rate of the input data signal. Thus, there is a problem in that the circuit can not output a clock signal (serial clock signal) having the same frequency of the input bit rate.

From this viewpoint, a clock/data recovery circuit which realizes a serial signal output function (clock and data) in addition to the parallel signal output function will be described in eighth to thirteenth embodiments.

Figure 30:
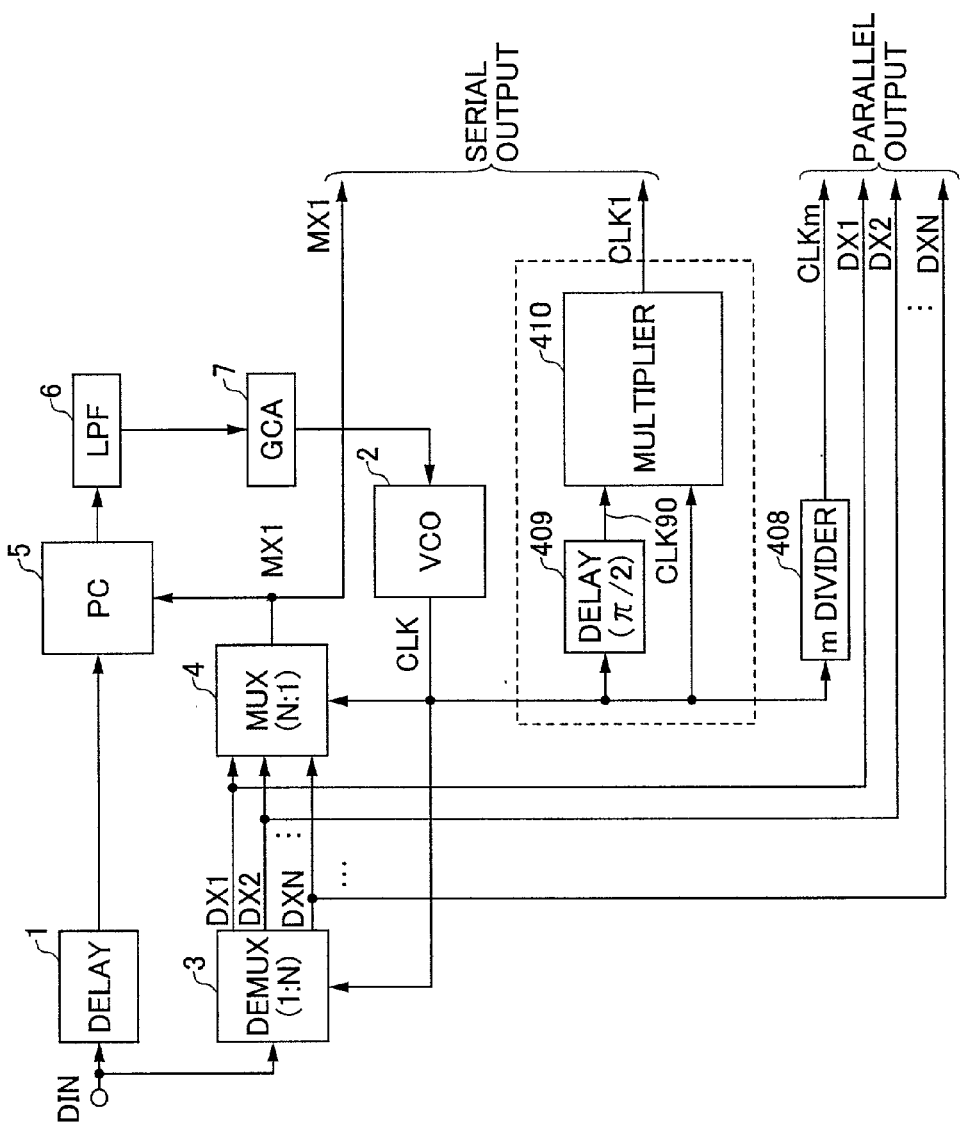
FIG. 30 is a block diagram of the clock/data recovery circuit of a eighth embodiment of the present invention.

FIG. 30 is a block diagram of the clock/data recovery circuit of the eighth embodiment of the present invention. In FIG. 30, 1 indicates a delay circuit which delays the input data signal DIN for timing adjustment, 2 indicates a voltage control oscillator (VCO) which oscillates at a frequency of 1/2 of the bit rate of the input data signal DIN, 3 indicates a demultiplexer (DEMUX) which performs 1:N (N≧2) demultiplexing operation for the input data signal DIN by using a clock signal CLK output from the voltage control oscillator 2, 4 indicates a multiplexer (MUX) 5 which performs N:1 multiplexing operation for the N output signals DX1, DX2, . . . , DXN from the demultiplexer 3 by using the clock signal CLK as a clock signal, 5 indicates an phase comparator (PC) including EXOR and the like which compares the output signal MX1 of the multiplexer 4 and the output signal of the delay circuit 1, 6 indicates a lowpass filter (LPF) which extracts DC voltage from the output signal of the phase comparator 5, and 7 indicates a gain control amplifier (GCA) which amplifies the output signal of the lowpass filter 6 and inputs the amplified signal into the voltage control oscillator 2 as a control voltage. 408 indicates an m divider which divides the clock signal CLK by m (m=N/2), 409 indicates a 90-degree delay circuit which delays the clock signal CLK by 90 degree, 410 indicates a multiplier which multiplies an output clock signal CLK90 of the 90-degree delay circuit 409 and the clock signal CLK, and outputs a clock signal CLK1.

Difference between configurations of FIG. 30 and FIG. 29 is that the 90-degree delay circuit 409 and the multiplier 410 are added. Therefore, in the configuration shown in FIG. 30, same operation as that shown in FIG. 29 is performed in the same parts as FIG. 29. The circuit shown in FIG. 30 outputs the clock signal CLKm from the m divider 408 and the output signals DX1, DX2, . . . , DXN of the demultiplexer 3 as parallel signals.

Figure 36:
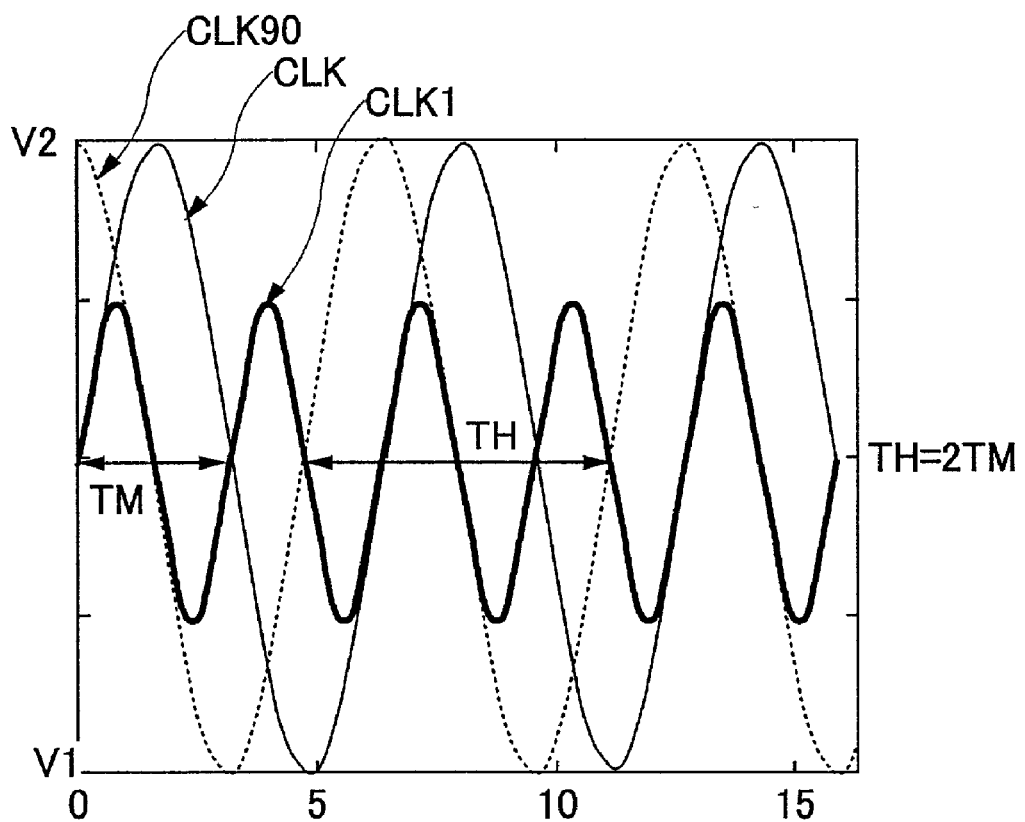
FIG. 36 shows input-output waveforms of a multiplier 10 in FIG. 30.

FIG. 36 shows input-output waveforms of the multiplier 410. Assuming that f is time (sec), the input clock signal CLK and CLK90 can be represented as $$CLK: y = \sin(2\pi ft) \qquad (6)$$

$$CLK90: y = \sin(2\pi ft + \pi/2) \qquad (7)$$

Thus, the clock signal CLK1 output from the multiplier 10 can be represented as $$CLK1: y = \sin(2\pi ft) \times \sin(2\pi ft + \pi/2) \quad (8)$$
$$= (1/2)\sin(2 \times 2\pi ft).$$

Since the period T1(sec) of the output clock signal CLK1 of the multiplier 410 is 1/2 of the period T of the output clock signal CLK of the voltage control oscillator 2, the frequency of the clock signal CLK1 becomes the same as the bit rate of the input data signal DIN.

Accordingly, a serial output signal including the clock signal CLK1 having the same frequency of the bit rate of the input data signal and the discriminated data signal MX1 of the same bit rate of that of the input data signal can be output in addition to the parallel output signals including the divided clock signal CLKm and the output signals DX1, DX2, . . . , DXN.

Ninth Embodiment

Figure 31:
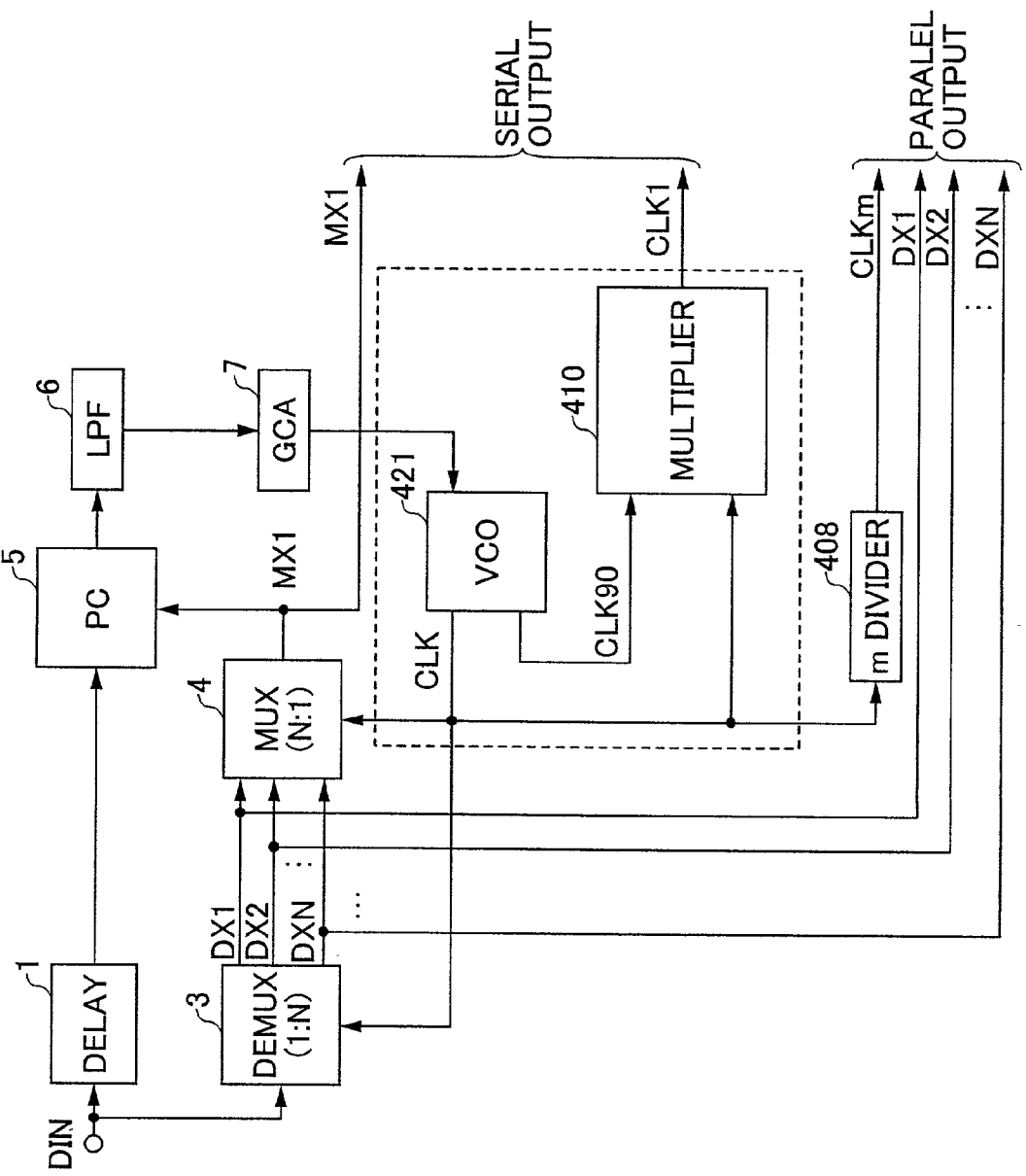
FIG. 31 is a block diagram of the clock/data recovery circuit of a ninth-embodiment of the present invention.

FIG. 31 is a block diagram of the clock/data recovery circuit of the ninth embodiment of the present invention. In FIG. 31, the same numeral is assigned to the same component as that of FIG. 30. In this configuration, a voltage control oscillator 421 is adopted in which the voltage control oscillator 421 outputs the clock signal CLK of the frequency of 1/2 of bit rate of the input data signal DIN and the clock signal CLK90 of which phase is shifted by 90 degree (that is, they are quadrature). Both of the clock signals CLK and CLK90 are input to the multiplier 410, so that the multiplier 41 outputs the clock signal CLK1 having a frequency which is two times of that of the clock signal CLK. Other parts are the same as those in FIG. 30.

Figure 37:
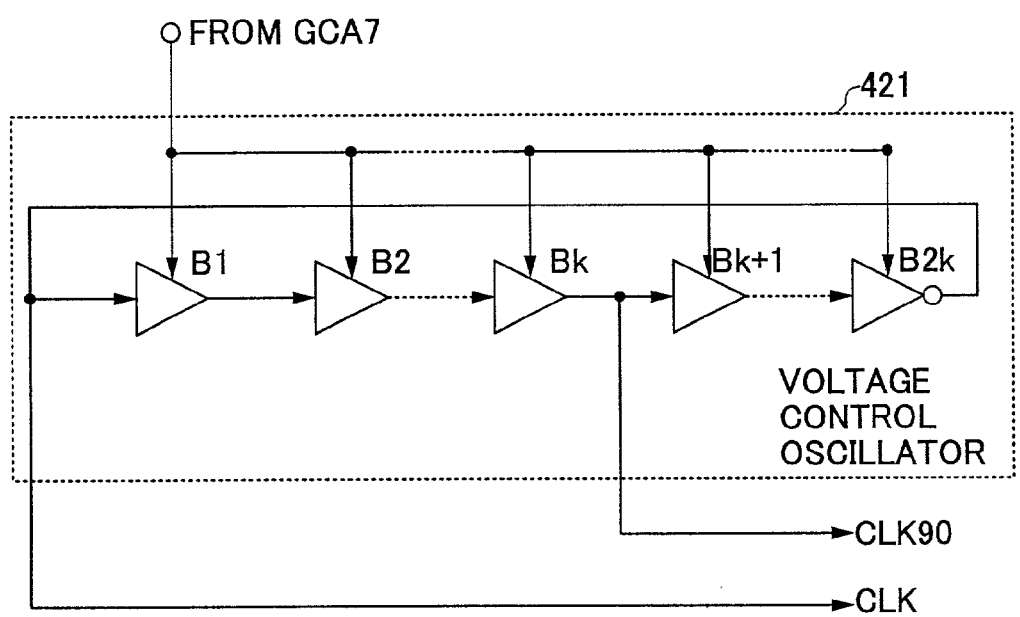
FIG. 37 shows a block diagram of a voltage control oscillator in FIGS. 31 and 33.

FIG. 37 shows the configuration of the voltage control oscillator 421. The voltage control oscillator 421 is configured such that buffer circuits B1, B2, . . . Bk, Bk+1, Bk+2, . . . , B2k of 2 k (k≧1) stages each having the same delay time are connected in series. In addition, the inverted signal of the output of the buffer B2k of the 2 kth (the last stage) is input to the buffer B1 of the first stage (ring oscillator type VCO). Assuming that delay time of a buffer circuit is tpd, the period T of the clock signal CLK from the voltage control oscillator 421 can be represented as T=4k× tpd (9).

Therefore, when the clock signal CLK is a signal input to-the first stage buffer circuit, the clock signal CLK90 the phase of which is shifted by 90 degree is an output of the buffer circuit Bk of the kth stage. The control voltage output from the gain control amplifier 7 controls the delay time tpd at the same time by controlling switching current of each buffer circuit.

In this embodiment, the 90-degree delay circuit 409 as shown in FIG. 30 is not necessary, so that simplified clock/data recovery circuit can be realized.

Tenth Embodiment

Figure 32:
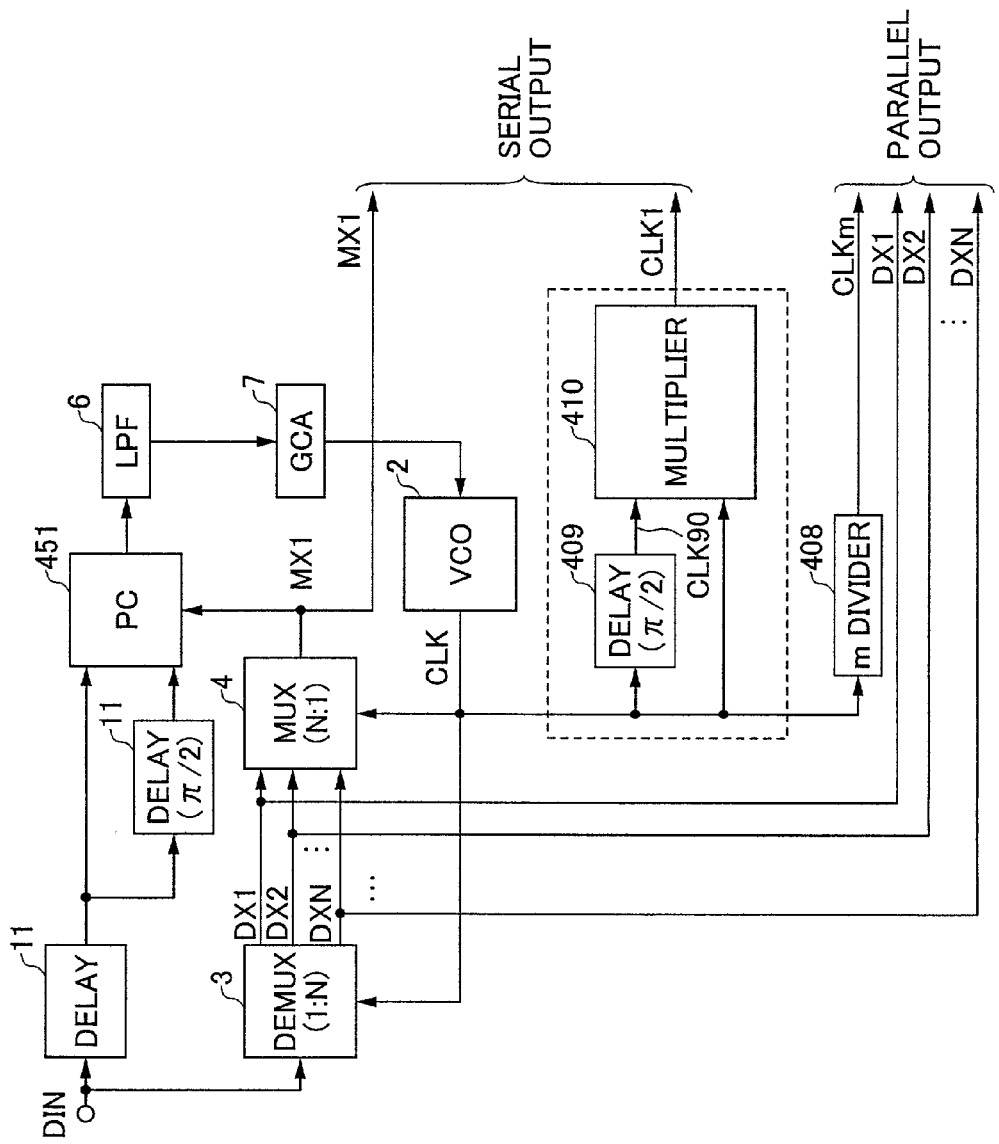
FIG. 32 is a block diagram of the clock/data recovery circuit of a tenth embodiment of the present invention.

FIG. 32 is a block diagram of the clock/data recovery circuit of the tenth embodiment of the present invention. In FIG. 32, the same numeral is assigned to the same component as that of FIG. 30. In this configuration, the output of the delay circuit 1 which delays the input data signal DIN is divided into two branches, and a 90-degree delay circuit 11 is connected to one of the branches. In addition, a phase comparator 451 which compares phases of another signal of the branches output from the delay circuit 1, the output signal of the 90-degree delay circuit 11 and the output signal MX1 of the multiplexer 4 is adopted. In this phase comparator 451, phase comparison between the output signal of the 90-degree delay circuit 11 and the output signal MX1 of the multiplexer 4 is performed first. Then, the result of the phase comparison and the output signal of the delay circuit 1 are compared (for example, Japanese laid-open patent application No. 5-56410). According to this phase comparator 451, input-data-pattern dependence of the response can be decreased.

According to this configuration, tolerance for the number of consecutive data bits can be improved compared with the circuit shown in FIGS. 30 and 31. The phase change of the output signal MX1 of the multiplexer 4 follows the phase change of the clock signal CLK. Thus, the phase comparator 451 outputs a phase comparison signal having a pulse width according to phase differences between the phase of MX1 and the phase of the input data signal DIN.

Eleventh Embodiment

Figure 33:
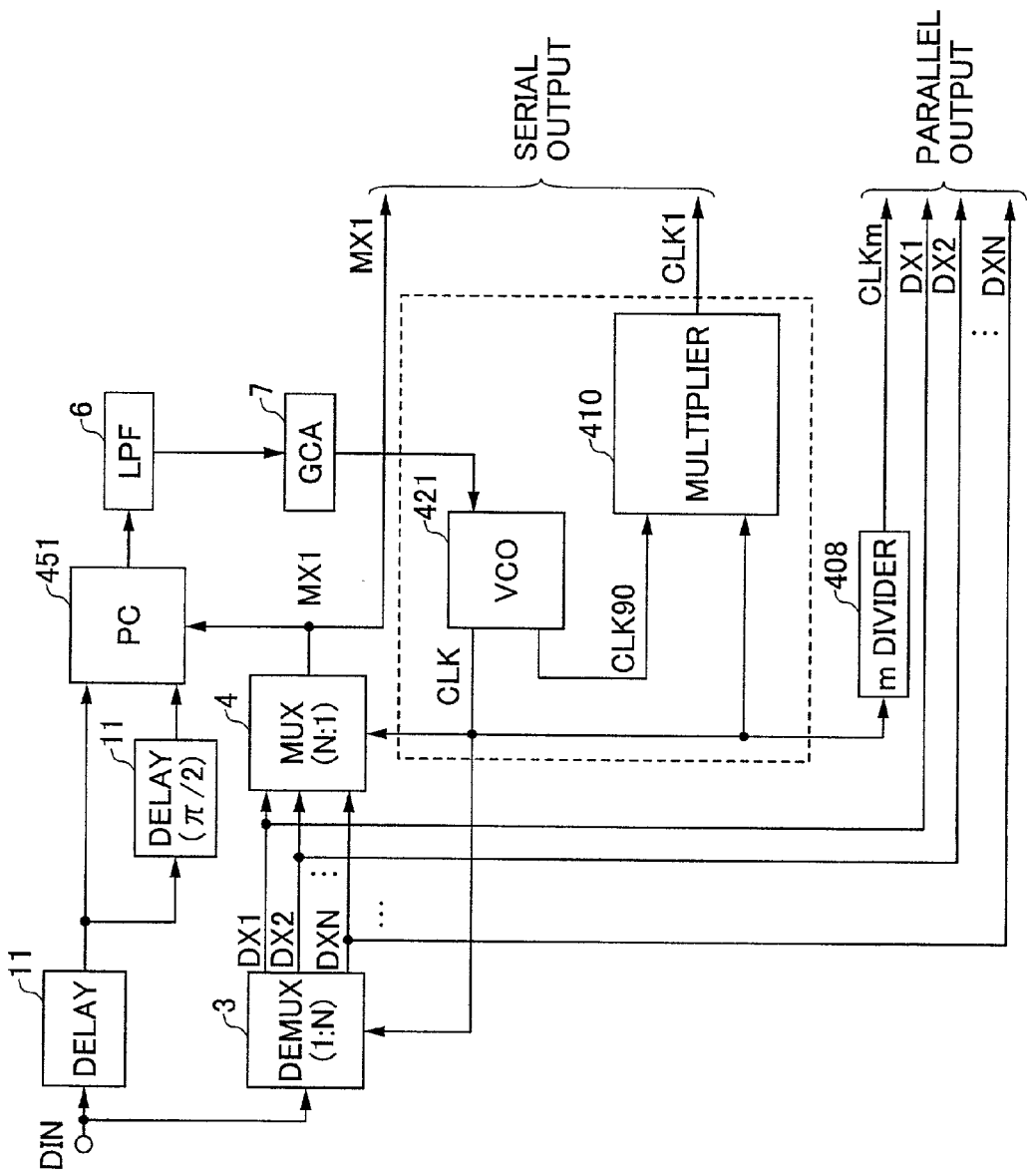
FIG. 33 is a block diagram of the clock/data recovery circuit of an eleventh embodiment of the present invention.

FIG. 33 is a block diagram of the clock/data recovery circuit of the eleventh embodiment of the present invention. In FIG. 33, the same numeral is assigned to the same component as that of FIG. 30. In this configuration, in the same way as FIG. 32, the output of the delay circuit 1 which delays the input data signal DIN is divided into two branches, and a 90-degree delay circuit 11 is connected to one of the branches. In addition, a phase comparator 451 receives another signal of the branches output from the delay circuit 1, the output signal of the 90-degree delay circuit 11 and the output signal MX1 of the multiplexer 4. In addition, in the same way as FIG. 31, a voltage control oscillator 421 is adopted in which the voltage control oscillator 421 outputs the clock signal CLK of the frequency of 1/2 of bit rate of the input data signal DIN and the clock signal CLK90 the phase of which is shifted by 90 degree. Both of the clock signals CLK and CLK90 are input to the multiplier 410, so that the multiplier 410 outputs the clock signal CLK1 having a frequency which is two times of the clock signal CLK.

According to this configuration, tolerance for the number of consecutive data bits can be improved, and the 90-degree delay circuit 409 is not necessary, so that simplified clock/data recovery circuit can be realized.

Twelfth Embodiment

Figure 34:
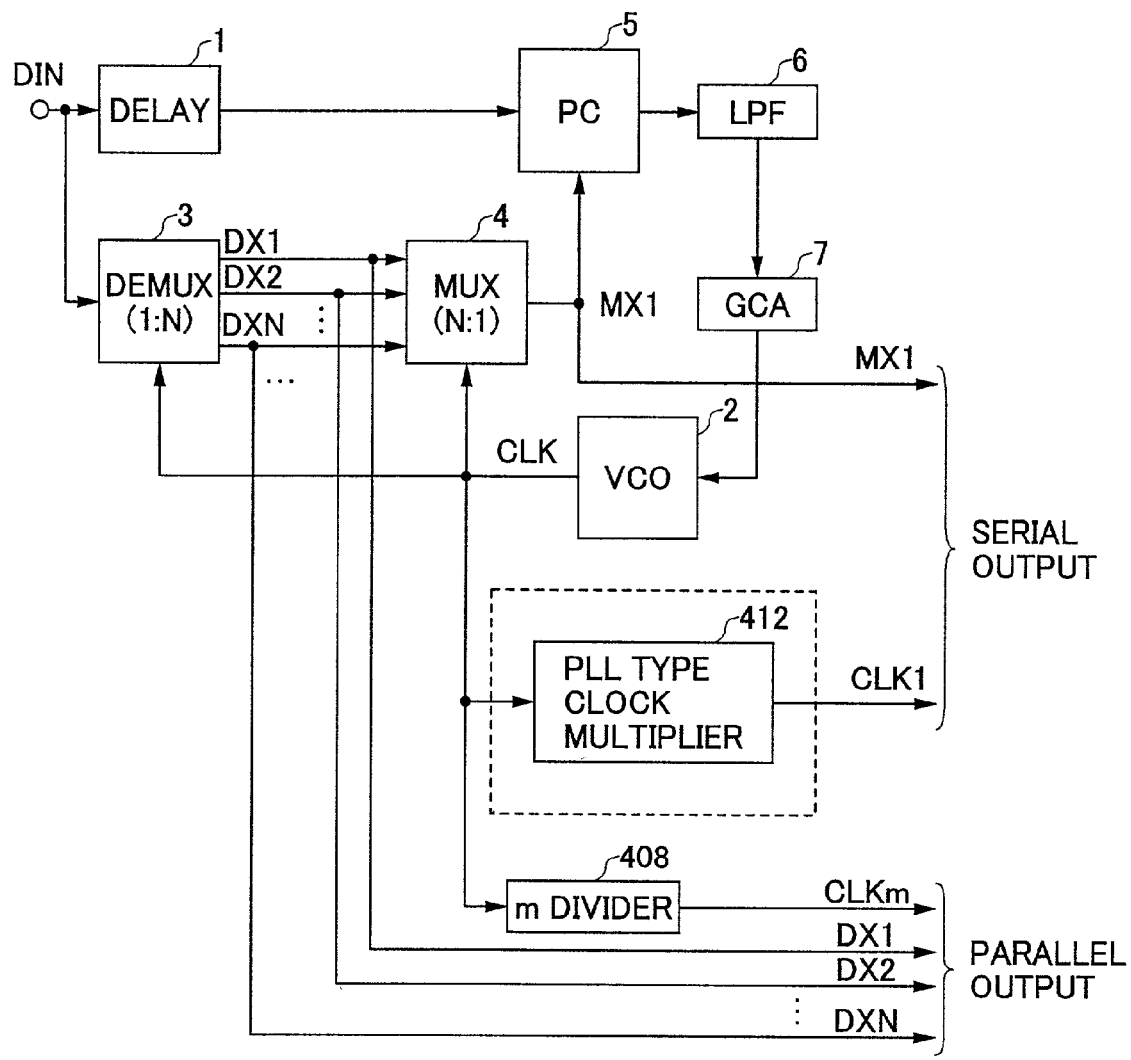
FIG. 34 is a block diagram of the clock/data recovery circuit of a twelfth embodiment of the present invention.

FIG. 34 is a block diagram of a clock/data recovery circuit of the twelfth embodiment of the present invention In FIG. 34, the same numeral is assigned to the same component as that of FIG. 30. In this configuration, the clock signal CLK output from the voltage control oscillator 2 is input to a PLL type clock multiplier 412, so that the clock signal CLK1 having the frequency of two times of that of the clock signal CLK is output.

Figure 38:
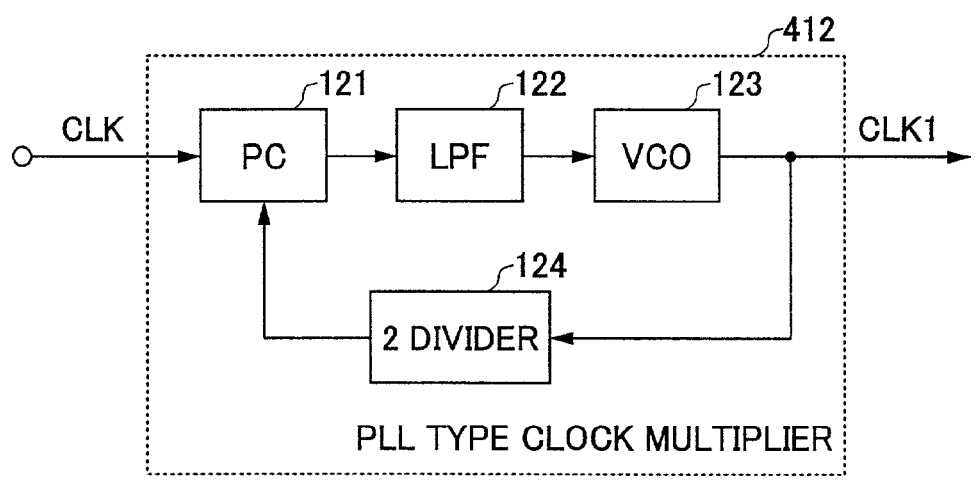
FIG. 38 is a block diagram of a PLL type clock multiplier of FIGS. 34 and 35.

FIG. 38 is a block diagram of an inside configuration of the PLL type clock multiplier 412. This multiplier 412 includes a phase comparator 121 which compares phases of the clock signal CLK and the output signal of the 2 divider 124, a lowpass filter 122 which extracts DC voltage from the output signal of the phase comparator 121, a voltage control oscillator 123 which oscillates the clock signal CLK1 by using the output signal of the lowpass filter 122 as a control voltage, and the 2 divider 124 which divides the frequency of the output clock signal CLK1 of the voltage control oscillator 123 into 1/2 frequency.

Thirteenth Embodiment

Figure 35:
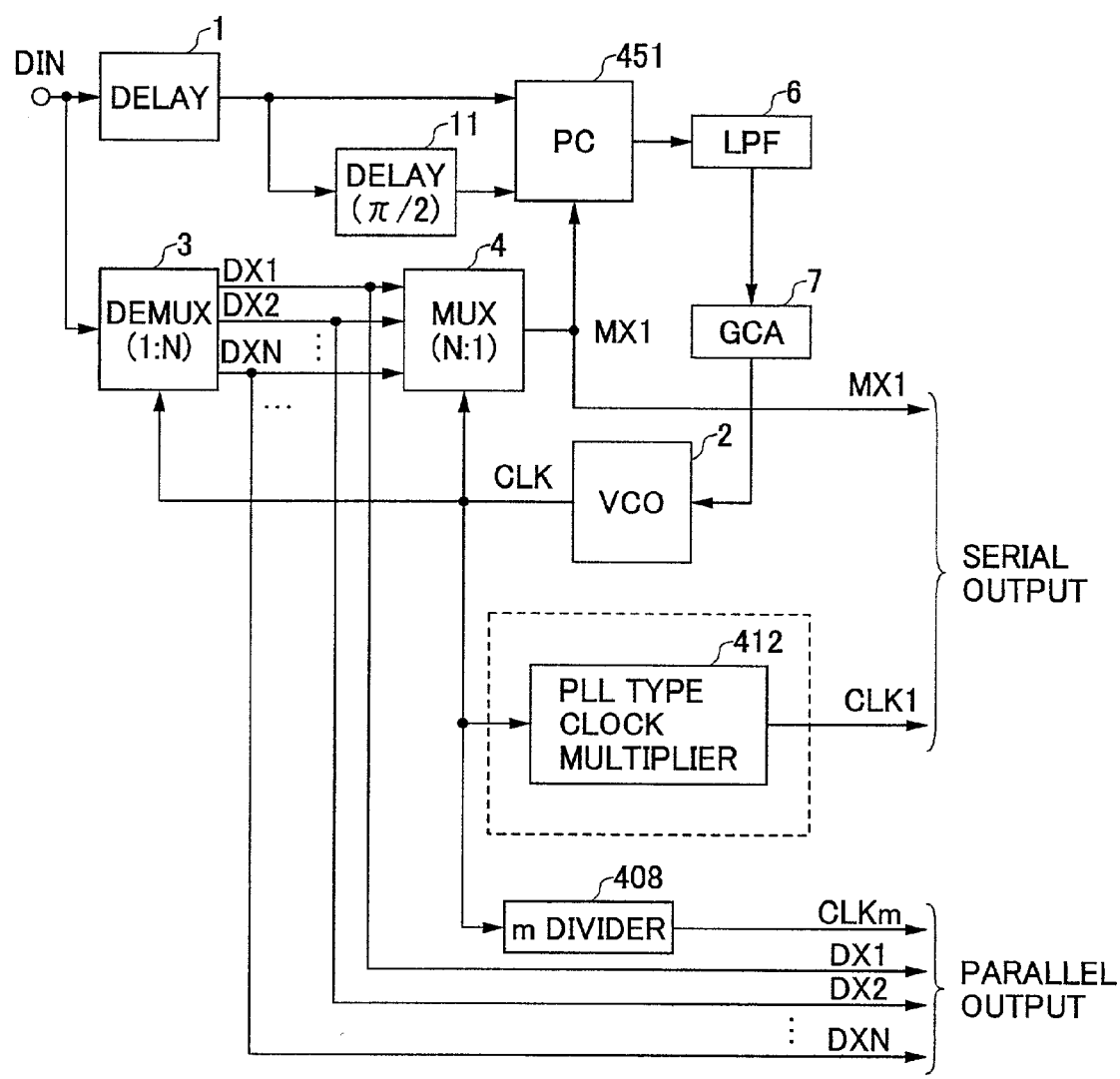
FIG. 35 is a block diagram of the clock/data recovery circuit of a thirteenth embodiment of the present invention.

FIG. 35 is a block diagram of the clock/data recovery circuit of the thirteenth embodiment of the present invention. In FIG. 35, the same numeral is assigned to the same component as that of FIG. 30. In this configuration, in the same way as FIG. 32, the output of the delay circuit 1 which delays the input data signal DIN is divided into two branches, and a 90-degree delay circuit 11 is connected to one of the branches. In addition, a phase comparator 451 receives another signal of the branches output from the delay circuit 1, the output signal of the 90-degree delay circuit 11 and the output signal MX1 of the multiplexer 4. In addition, the PLL type clock multiplier 412 is adopted in which the clock signal CLK output from the voltage control oscillator 2 is input to the PLL type clock multiplier 412, so that the clock signal CLK1 having the frequency of two times of that of the clock signal CLK is generated.

As mentioned above, according to the present invention described in the eighth to thirteenth embodiments, in a clock/data recovery circuit using the voltage control oscillation which oscillates at frequency of 1/2 of bit rate of the input data signal, a signal of which the frequency is two times of that of the clock signal output from the voltage control oscillator can be easily generated. Thus, there is an advantage that the circuit can realize output function of the serial signal of the clock and data in addition to the conventional parallel signal output function.

Also in the eighth to thirteenth embodiments, general configurations as described in the sixth embodiment can be adopted.

Fourteenth Embodiment

Figure 39:
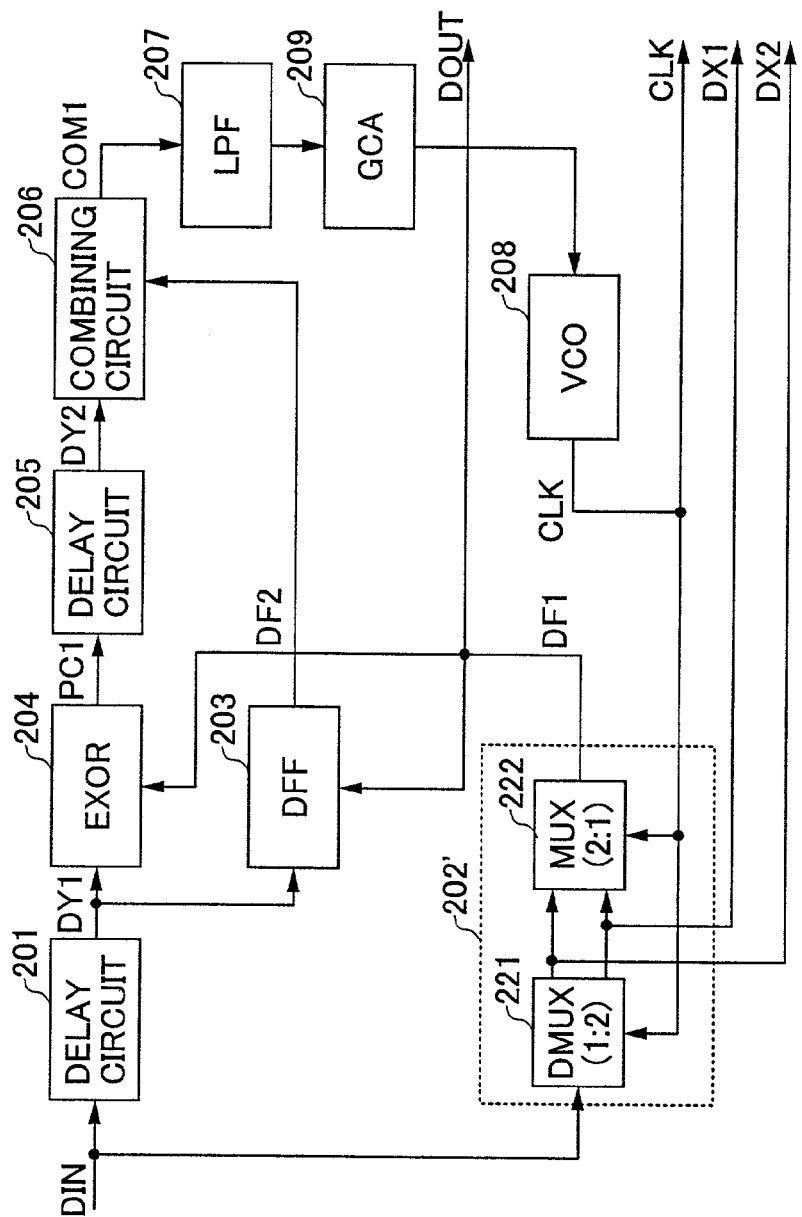
FIG. 39 is a block diagram of the clock/data recovery circuit of a fourteenth embodiment of the present invention.

Another example of the CDR circuit using the discriminator consisting of DEMUX and MUX described in the above-mentioned embodiments is shown in FIG. 39.

201 indicates a first delay circuit which delays the input data signal DIN, 202' indicates a discriminator including an 1:2 demultiplexer 221 and a 2:1 multiplexer 222, 203 indicates a D-type ms-flip flop circuit which discriminates an output data signal DY1 of the delay circuit 201 by using the output data signal DF1 of the discriminator 202', 204 indicates a phase comparator of EXOR type which compares phases of the output data signal DY1 of the delay circuit 201 and the output data signal DF1 of the discriminator 202', 205 indicates a second delay circuit which delays an output signal PC1 of the phase comparator 204, 206 indicates a combining circuit which receives the output signal DY2 of the delay circuit 205 and the output data signal DF2 of the D-type ms-flip flop circuit 203 and outputs a pulse signal COM1 (three value) of +1, −1 or 0, 207 indicates a lowpass filter (LPF) which extracts DC voltage from the output signal COM1 of the combining circuit 206, 208 indicates a voltage control oscillator by which frequency of oscillating clock signal CLK is controlled by a voltage signal output from the gain control amplifier 209, 209 indicates a gain control amplifier (GCA) in which gain adjustment is available from the outside.

In the circuit 202' including the 1:2 demultiplexer 221 and the 2:1 multiplexer 222, the 1:2 demultiplexer 221 demultiplexes the input data signal DIN into two parallel demultiplexed data signals DX1 and DX2, and the multiplexer 222 multiplexes the data signals DX1 and DX2 into a serial data signal DF1.

In this embodiment, the phase comparator 204 outputs a signal PC1 having a pulse width corresponding to phase difference between the data DF1 discriminated by the circuit 202' and the output data DY1 of the delay circuit 201. In addition, the D-type ms-flip flop circuit 203 outputs a signal of 0 when the output signal DF1 of the circuit 202' leads the output signal DY1 of the delay circuit 201, and the D-type ms-flip flop circuit 203 outputs a signal of 1 when the output signal DF1 of the circuit 202' lags the output signal DY1 of the delay circuit 201. That is, decision of lead/lag of phase is performed in the D-type ms-flip flop circuit 203 and the phase comparator 204 detects lead/lag magnitude of the phase.

Then, the combining circuit 206 combines the signal DY2 generated by delaying the output signal PC1 of the phase comparator 204 by the delay circuit 205 and the output signal DF2 of the D-type ms-flip flop circuit 203. The combining circuit 206 operates as shown in FIG. 40, so that it outputs a pulse signal COM1 of three value of +1, −1 or 0. That is, when the clock signal CLK leads the input data signal DIN, the combining circuit 206 outputs a signal of 1 having a pulse width which is proportionate to the magnitude of lead. When the clock signal CLK lags the input data signal DIN, the combining circuit 206 outputs a signal of −1 having a pulse width which is proportionate to the magnitude of lag. When the output from the phase comparator 204 is 0 (there is no phase comparison information), the combining circuit 206 outputs a signal of 0.

Figure 41:
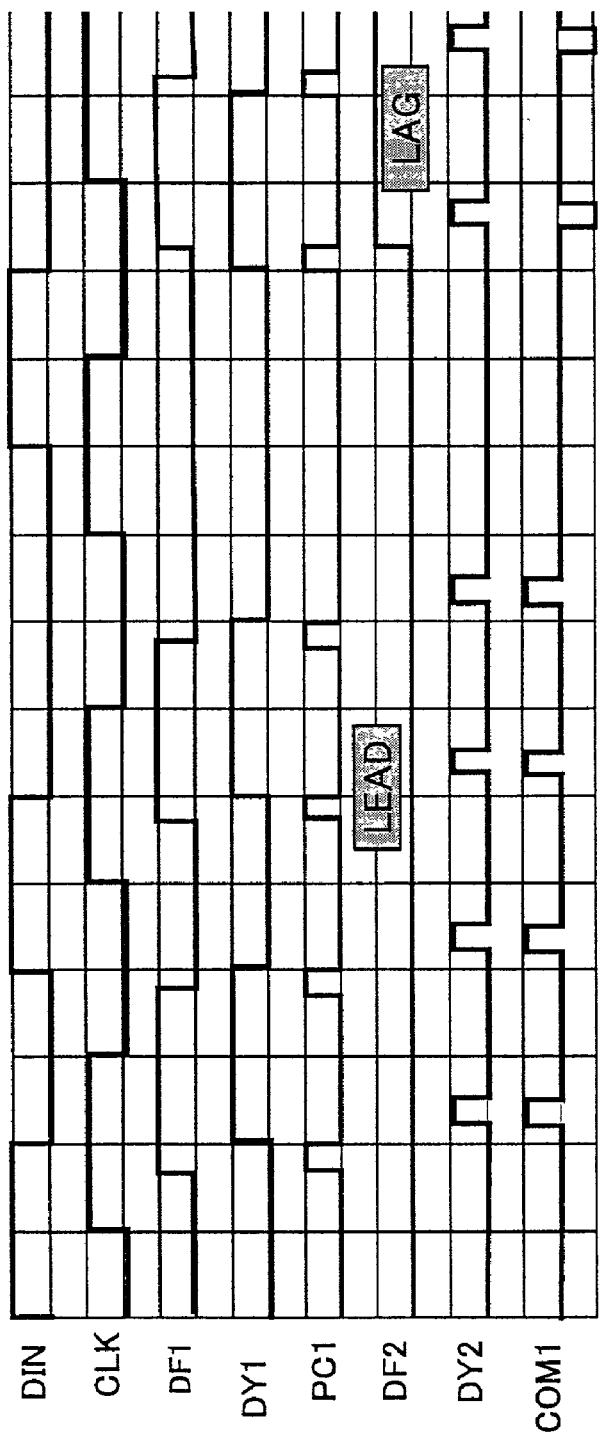
FIG. 41 is a timing chart of a circuit of FIG. 39.

FIG. 41 shows a timing chart of the above operation. According to this embodiment, since decision of lead/lag of phase and detection of lead/lag magnitude are performed by different circuits respectively, phase margin becomes large, so that synchronization operation (pull-in operation) is stabilized.

Figure 42:
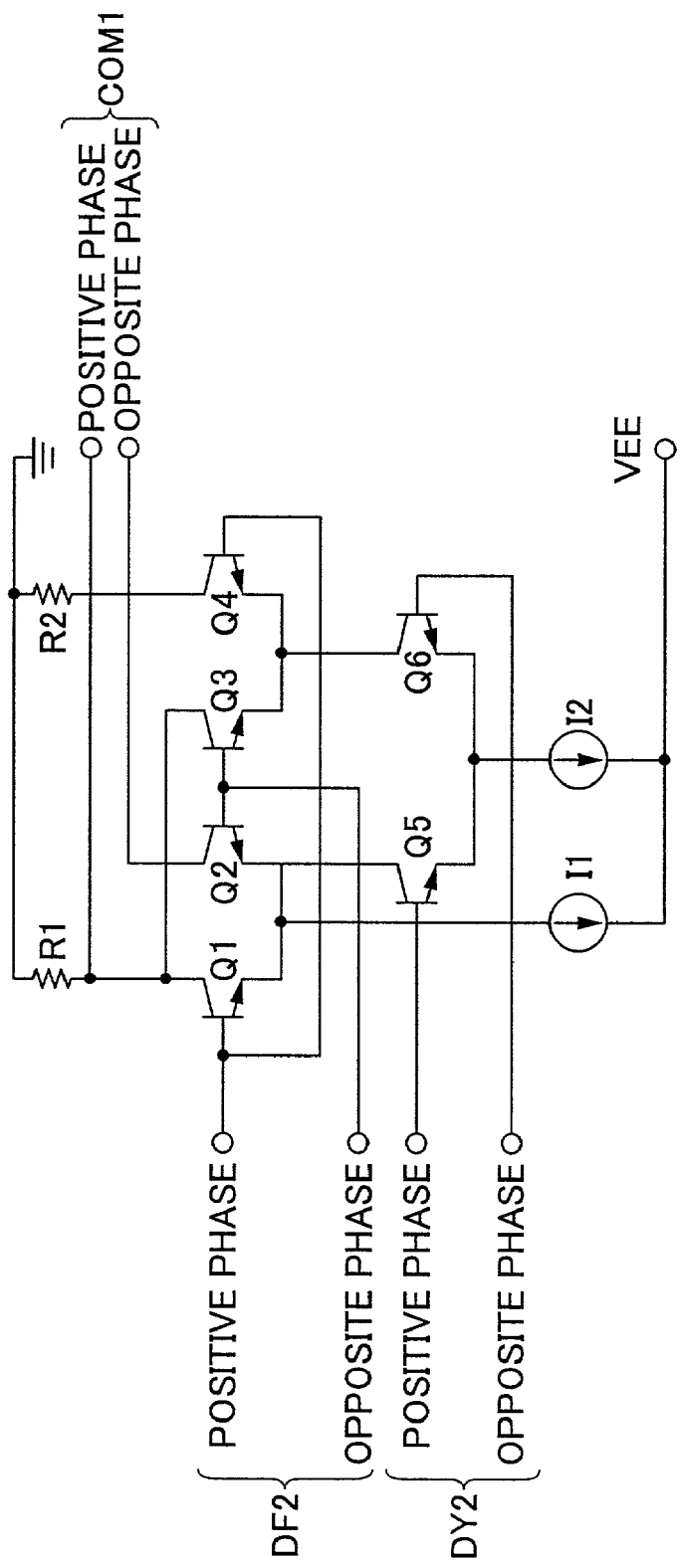
FIG. 42 is a concrete circuit diagram of the combining circuit of the circuit of FIG. 39.

FIG. 42 shows a circuit diagram indicating an inside configuration of the combining circuit 206. Differential input is assumed in FIG. 42. The combining circuit 206 includes transistors Q1, Q2 which form a first ECL circuit, transistors Q3, Q4 which form a second ECL circuit, transistors Q5, Q6 which form a third ECL circuit, a load resistance R2 common for the transistors Q2, Q4, and first and second current sources I1, I2. The currents of the current sources are I1 and I2 respectively and I1=I2 is assumed. A common emitter of the transistors Q1, Q2 is connected to a collector of the transistor Q5 and the current source I1, a common emitter of the transistors Q3, Q4 is connected to a collector of the transistor Q6, a common emitter of the transistors Q5, Q6 is connected to the current source I2.

A non-inverted signal of the output signal DF2 of the D-type ms-flip flop circuit 203 is input into a base of the transistors Q1, Q4, the inverted signal of DF2 is input to a base of the transistors Q2, Q3. A non-inverted signal of the output signal DY2 of the delay circuit 5 is input into a base of the transistor Q5, the inverted signal of DY2 is input to a base of the transistor Q6. By configuring the combining circuit 6 in this way, it outputs the pulse signal COM1 of three value of +1, −1 or 0 shown in FIG. 40 according to the sign of the input signal DF2 and DY2.

In this embodiment, the 1:2 demultiplexer 221 and the 2:1 multiplexer 222 which form the circuit 202' perform demultiplexing and multiplexing by using the clock signal CLK, the frequency of the clock signal CLK can be 1/2 of the bit rate of the input data signal DIN. That is, operation speed required for the voltage control oscillator 208 can be lowered, so that speedup becomes available.

In the configuration, by inserting the gain control amplifier (GCA) 209 which enables gain adjustment from the outside, loop bandwidth of the PLL loop can be adjusted, so that it becomes possible to adjust jitter transfer characteristics and the range of pull-in range.

Figure 43:
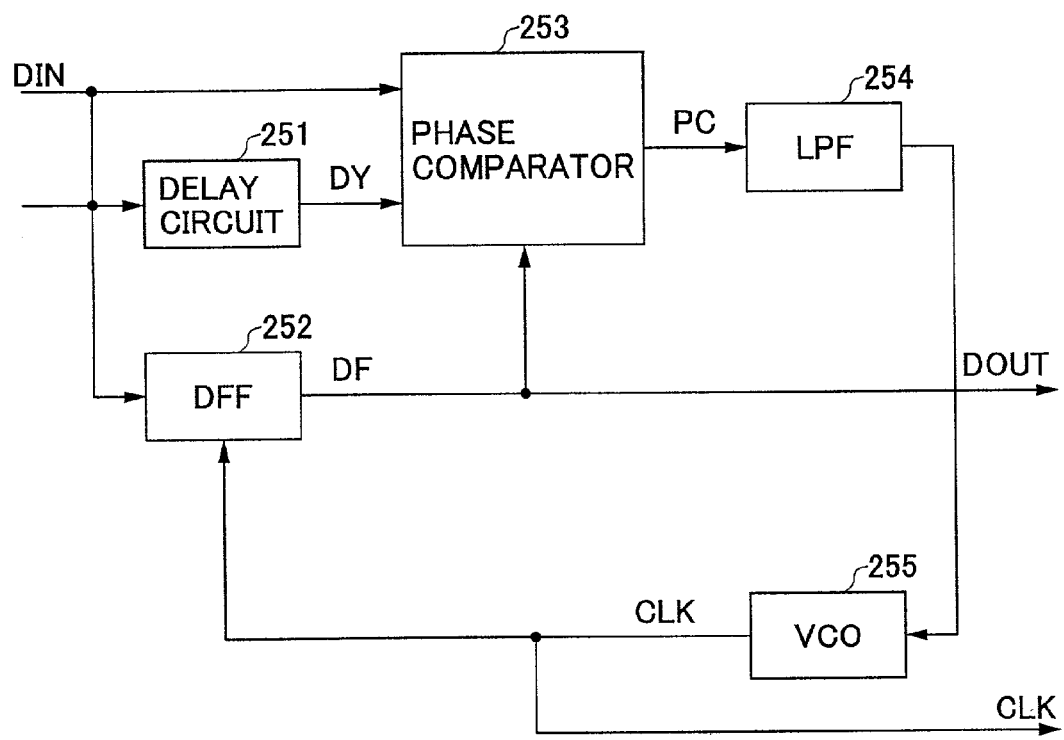
FIG. 43 is a block diagram of a conventional clock/data recovery circuit.

According to this configuration, compared with the conventional configuration shown in FIG. 43, different circuits are used for decision of phase lead/lag and detection of the magnitude of lead/lag, the phase margin becomes 1.3 times. In addition, by adopting the configuration using the 1:2 demultiplexer 221 and the 2:1 multiplexer 222, speedup is achieved, so that pull-in range becomes about 2.1–2.6 times of the conventional configuration shown in FIG. 43 for example. In a conventional clock/data recovery circuit including a demultiplexing/multiplexing circuit of 10 Gb/s, when the pull-in range is 200 MHz, it can be increased to 420–520 MHz according to this embodiment.

By configuring the demultiplexer 221 to perform 1:N demultiplexing and the multiplexer 222 to perform N:1 multiplexing, since the frequency required for the clock signal CLK becomes 1/N, further speedup becomes possible, so that the bit rate of input data signal to which the clock/data recovery circuit can achieve lock can be further increased.

In addition, also in the fourteenth embodiment, the configurations of the sixth embodiments can be adopted. According to this embodiment, phase margin for phase comparison is extended, so that pull-in operation using higher frequency is stabilized. In addition, by adopting demultiplexing and multiplexing, pull-in operation using further higher frequency is stabilized.

Fifteenth Embodiment

Figure 44:
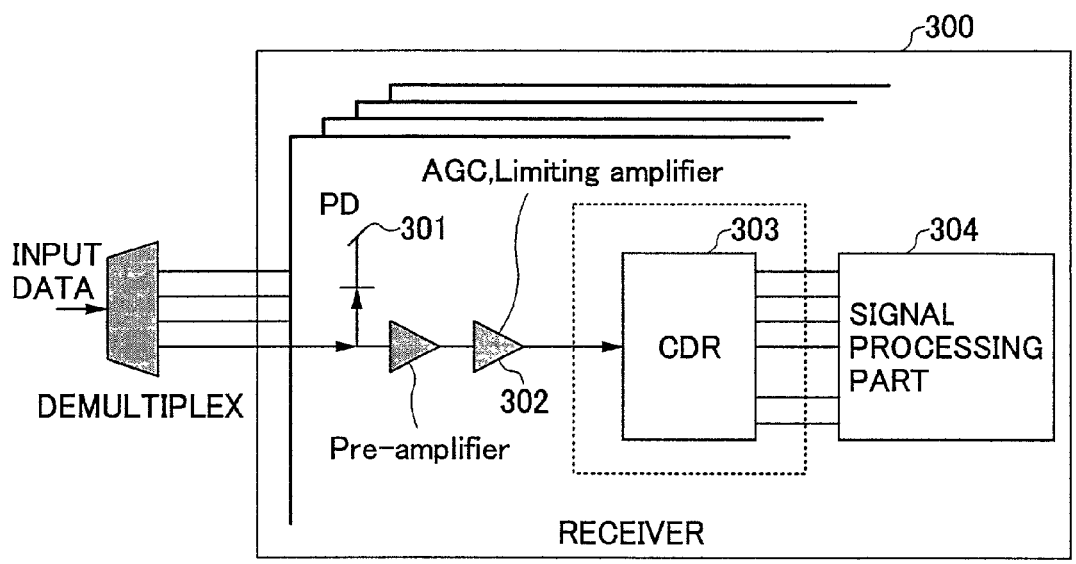
FIG. 44 is a block diagram of a receiving apparatus which includes a CDR circuit of the present invention.

FIG. 44 shows a receiving apparatus 300 which includes a CDR circuit of the present invention. The receiving apparatus 300 is used in high speed optical communication and the like. In the receiving apparatus 300, when the input data signal is an optical signal, the input optical data signal is optical-to-electrical converted by an optical/electrical converter which includes a photo detector 301, and electrical signal level and the amplitude of the converted output are adjusted by the AGC amplifier and the limiting amplifier 302. Then, the signal is input to the CDR circuit 303 of the present invention, and the parallel signals (demultiplexed signals) and divided clock signal are output.

In addition, a transmission apparatus can be configures in which the parallel signals (demultiplexed signals) and divided clock signal are input to the signal processing circuit 304, and the output of the signal processing circuit is input to a sending apparatus, and a signal is output to the outside.

Effects of the Present Invention

As described above, according to the present invention, the input data signal is converted into a data signal in which the phase corresponds with that of the output clock signal of the voltage control oscillator by performing demultiplexing/multiplexing operation. By comparing phases of this data signal and the input data signal, the phase comparison signal according to the phase difference can be output even when the frequency of voltage control oscillator is 1/2 of that of the conventional circuit, and the feedback voltage to the voltage control oscillator becomes a voltage according to phase difference. Thus, low jitter can be realized.

Figure 4:
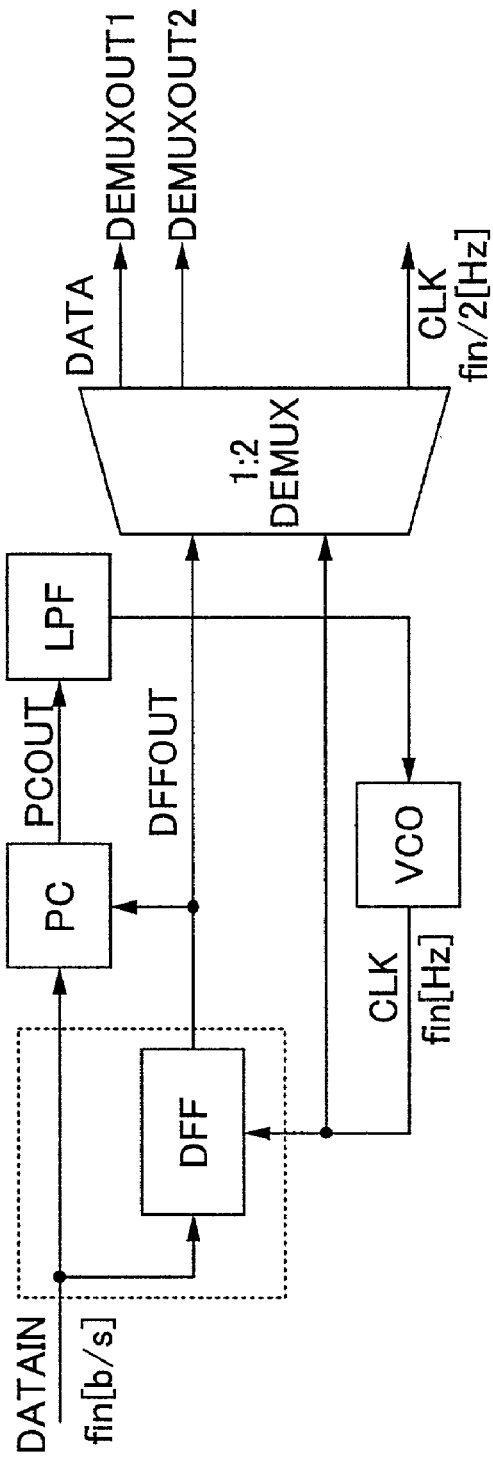
FIG. 4 shows another example of a conventional clock/data recovery circuit.

When considering a configuration which simply uses the discriminator consisting of the 1:2 DEMUX and the 2:1 MUX as DFF for a conventional CDR circuit shown in FIG. 4 for improving operating margin, a clock signal is provided to the 1:2 DEMUX via a TFF which decreases the frequency of the clock output from VCO oscillating at frequency same as bit rate of input data to 1/2. In this case, operating margin of the discriminator is increased. However since the VCO oscillates at the same frequency as the bit rate of the input data, high speed operation is required for the circuits forming the VCO and circuits forming the TFF. In addition, high speed signals are transmitted in signal lines between VCO-TFF. As a result, operation of CDR+DEMUX is limited to the performance of operation of the VCO and TFF. In addition, a problem that the high speed signals between VCO-TFF are sensitive to noise leaking from other circuits arises On the other hand, according to the present invention, the discriminator is configured by the 1:2 demultiplexer and the 2:1 multiplexer and the VCO oscillates at a speed of 1/2 of that of the conventional VCO. Thus, high speed stabilized operation of CDR is realized, and DEMUX data output in the discriminator can be used as demultiplexed data output, and the DEMUX clock output can be used as VCO output. Therefore, the last stage 1:2 DEMUX shown in FIG. 4 becomes unnecessary and reduction of power requirements can also be realized.

According to the configuration of the present invention, operation speed required for the VCO circuit becomes 1/2 of that of conventional configuration. Since the maximum frequency which can be generated by a VCO realized by circuits using Si bipolar device of fT=40 [GHz] is about 10 G[Hz], the maximum input data signal bit rate fmop for the conventional CDR is 10 G[b/s]. On the other hand, even when the same device is used, by adopting the configuration of the present invention, the CDR can perform pull-in operation for data signals up to fmop=20 G[b/s] and the CDR can operate at a speed of up to two times of conventional one. In addition, power consumption of the demultiplexer of the last part of the conventional configuration is 20% of the whole power consumption. Thus, since the demultiplexer of the last part becomes unnecessary according to the present invention, power reduction about 20[%] becomes available.

In addition, in contrast to using the DEMUX or DEMUX+MUX only as bit discrimination for the input signal as described in documents (:M. Wurzer, et.al.,"A 40-Gb/s Integrated Clock and Data Recovery Circuit in a 50-GHz Silicon Bipolar Technology," IEEE J. Solid-State Circuits, VOL. 34, NO. 9, pp. 1320–1324 September 1999.) and (J. savoj, et. al., "A 10 Gb/s CMOS Clock and Data Recovery Circuit with Frequency Detection ", 2001. IEEE ISSCC), the input data signal phase is converted to VCO clock signal phase according to the present invention. Thus, the phase comparator can perform linear comparison between the input data signal and DEMUX+MUX output signal. As a result, the phase comparator outputs a signal having a pulse width proportionate to phase difference between the input data signal and data signals the phase timing of which coincides with that of VCO clock signal. Then, the analog component of the phase comparison signal is fed back to the VCO, so that synchronization status of PLL can be realized. According to this linear phase comparison method, the effect of jitter decreasing can be obtained.

As mentioned above, according to the present invention, the low jitter, small and low power consumption clock/data recovery circuit can be realized in which the clock/data recovery circuit is used as an optical front end circuit receiver and the like in-a router or in a cross connect switch in SDH/SONET, point-to point transmission, GbE/10GbE and Fiber Channel in an optical communication system. As a result, lowering cost of an optical front end module can be realized and the cost of a communication system can be decreased.

The present invention is not limited to the specifically disclosed embodiments, and variations and modifications may be made without departing from the scope of the invention.

What is claimed is:

1. A clock/data recovery circuit comprising:
a voltage control oscillator for generating a clock signal of a frequency of 1/K (K=2, 3, ...) of a bit rate of an input data signal;
a delay circuit for delaying said input data signal for timing adjustment;
a demultiplexer for demultiplexing said input data signal into M demultiplexed signals (M=2, 3, ...) by using said clock signal;
a multiplexer for multiplexing said M demultiplexed signals by using said clock signal;
a phase comparator for comparing phases of an output signal of said delay circuit and an output signal of said multiplexer;
a lowpass filter for extracting DC voltage from an output signal of said phase comparator and for inputting said DC voltage to said voltage control oscillator as a control voltage;
wherein said clock/data recovery circuit outputs said clock signal generated by said voltage control oscillator as a recovery divided clock signal, and outputs said M demultiplexed signals from said demultiplexer as recovery parallel data signals.

2. The clock/data recovery circuit as claimed in claim 1, wherein M=K×L in which L is a number by which said clock signal is divided.

3. The clock/data recovery circuit as claimed in claim 1, said clock/data recovery circuit comprising:
another delay circuit, provided before said delay circuit, for delaying said input data signal; and
another phase comparator, instead of said phase comparator, for comparing phases of said output signal of said delay circuit and said output signal of said multiplexer, and comparing phases of a result of comparison of phases of said output signal of said delay circuit and said output signal of said multiplexer and an output signal of said another delay circuit.

4. The clock/data recovery circuit as claimed in claim 1, when K=2 and M=2, said demultiplexer comprising:
a first D-type ms-flip flop circuit for receiving said input data signal by using said clock signal; and
a second D-type ms-flip flop circuit for receiving said input data signal by using an inverted signal of said clock signal;
said multiplexer comprising:
a clock delay circuit for delaying said clock signal; and
a selector for selecting alternately an output signal of said first D-type ms-flip flop circuit and an output signal of said second D-type ms-flip flop circuit by using an output signal of said clock delay circuit.

5. The clock/data recovery circuit as claimed in claim 2, when K=2, said demultiplexer comprising:
a first demultiplexer for demultiplexing said input data signal into two first parallel data signals by using said clock signal;
two second demultiplexers each of which demultiplexes one of said first parallel signals into L second parallel data signals by using a divided clock signal generated dividing said clock signal by L and said clock signal;

said multiplexer comprising:
two first multiplexers each of which multiplexes said L second parallel data signals into serial data by using said divided clock signal and said clock signal; and
a second multiplexer for multiplexing two parallel data signals output from said two first multiplexer into serial data by using said clock signal.

6. The clock/data recovery circuit as claimed in claim 2, when K=2 and M=$2^T$ (T is an integer equal to or larger than 2), said demultiplexer comprising:
T stages in which a Qth (Q=1, 2, 3 ... T) stage includes $2^{(Q-1)}$ 1:2 demultiplexers, and a divided clock signal generated by dividing said clock signal by $2^{(Q-1)}$ is provided to each 1:2 demultiplexer in said Qth stage;
said multiplexer comprising:
T stages in which a Qth (Q=1, 2, 3 ... T) stage includes $2^{(T-Q)}$ 2:1 multiplexers, a divided clock signal generated by dividing said clock signal by $2^{(T-Q)}$ is provided to each 2:1 multiplexer.

7. The clock/data recovery circuit as claimed in claim 2, when K>2, said demultiplexer comprising:
a part for generating K−1 signals in which phases are different each other with respect to said clock signal;
a first demultiplexer for demultiplexing said input data signal into K first parallel data signals by using said K−1 signals and said clock signal; and
K second demultiplexers each of which demultiplexes one of said first parallel data signals into L second parallel data signals;
said multiplexer comprising:
K first multiplexer each of which
multiplexes said L second parallel data signals into serial data by using said divided clock signal and said clock signal; and
a second multiplexer for multiplexing K parallel data signals output from said K first multiplexers into serial data by using a multiplied signal generated by multiplying said clock signal and said clock signal.

8. A clock/data recovery circuit comprising:
a voltage control oscillator for generating a clock signal of a frequency of 1/K (K=2, 3, ...) of a bit rate of an input data signal;
a Q divider for receiving said input data signal and for dividing a frequency of said input data signal by Q (Q=2, 3, 4 ...);
a first demultiplexer for demultiplexing an output signal of said Q divider into M demultiplexed signals (M=2, 3, ...) by using said clock signal;
a second demultiplexer for demultiplexing said input data signal into N demultiplexed signals by using said clock signal;
a multiplexer for multiplexing said M demultiplexed signals output from said first demultiplexer into a signal by using said clock signal;
a phase comparator for comparing phases of an output signal of said Q divider and an output signal of said multiplexer;
a lowpass filter for extracting DC voltage from an output signal of said phase comparator and for inputting said DC voltage to said voltage control oscillator as a control voltage; and
an m(=N/K) divider for dividing a frequency of an output clock signal of said voltage control oscillator by m;
wherein said clock/data recovery circuit outputs an output signal of said m(=N/K) divider as a recovery divided signal, and outputs said N demultiplexed signals output from said second demultiplexer as recovery parallel data signals.

9. The clock/data recovery circuit as claimed in claim 8, wherein M=K×L in which L is a natural number.

10. The clock/data recovery circuit as claimed in claim 8, said clock/data recovery circuit comprising:
   a delay circuit provided after said Q divider (Q=2, 3, 4 . . . ); and
   another phase comparator, instead of said phase comparator, for comparing-phases of an output signal of said delay circuit and said output signal of said multiplexer, and comparing phases of a result of comparison of phases of said output signal of said delay circuit and said output signal of said multiplexer and an output signal of said Q divider.

11. The clock/data recovery circuit as claimed in claim 8, when K=2 and M=2, said first demultiplexer comprising:
   a first D-type ms-flip flop circuit for receiving an output signal of said Q divider by using said clock signal; and
   a second D-type ms-flip flop circuit for receiving an output signal of said Q divider by using an inverted signal of said clock signal;
   said multiplexer comprising:
   a clock delay circuit for delaying said clock signal; and
   a selector for selecting alternately an output signal of said first D-type ms-flip flop circuit and an output signal of said second D-type ms-flip flop circuit by using an output signal of said clock delay circuit.

12. The clock/data recovery circuit as claimed in claim 1, when K=2, said clock/data recovery circuit comprising:
   an m(=M/K) divider for outputting a divided clock signal generated by dividing said clock signal by m;
   a 90-degree delay circuit for delaying said clock signal output from said voltage control oscillator by 90 degree; and
   a multiplier for multiplying an output signal from said 90-degree delay circuit and a clock signal output from said voltage control oscillator, and outputting a clock signal the frequency of which is the same as bit rate of said input data signal;
   wherein said clock/data recovery circuit outputs a data signal from said multiplexer and a clock signal from said multiplier as a serial data signal.

13. The clock/data recovery circuit as claimed in claim 3, when K=2, said clock/data recovery circuit comprising:
   an m(=M/K) divider for outputting a divided clock signal generated by dividing said clock signal by m;
   a 90-degree delay circuit for delaying said clock signal output from said voltage control oscillator by 90 degree; and
   a multiplier for multiplying an output signal from said 90-degree delay circuit and a delay clock signal from said voltage control oscillator, and outputting a clock signal of which the frequency is the same as bit rate of said input data signal;
   wherein said clock/data recovery circuit outputs a data signal from said multiplexer and a clock signal from said multiplier as a serial data signal.

14. The clock/data recovery circuit as claimed in claim 12, instead of providing said 90-degree delay circuit, wherein said voltage control oscillator outputs a quadrature clock signal having the same frequency as said clock signal and being quadrature to said clock signal, said multiplier receives said clock signal and said quadrature clock signal and outputs a clock signal having the same frequency as bit rate of said input data signal.

15. The-clock/data recovery circuit as claimed in claim 1, said clock/data recovery circuit comprising:
   an m divider for outputting a divided clock signal generated by dividing said clock signal by m; and
   a K multiplier for multiplying said clock signal by K, so that a clock signal having the same frequency as bit rate of said input data signal is output;
   wherein said clock/data recovery circuit outputs a data signal from said multiplexer and a clock signal from said K multiplier as a serial data signal.

16. The clock/data recovery circuit as claimed in claim 14, said voltage control oscillator comprising 2k (k≧1) buffer circuits having the same delay time in which said delay time is controlled by a control voltage, said buffer circuits being connected in series, an inverted signal of the output of a 2kth buffer circuit is input to a first stage buffer circuit;
   wherein an input of said first stage buffer circuit is said clock signal and an output of kth stage buffer circuit is said quadrature clock signal.

17. The clock/data recovery circuit as claimed in claim 15, said K multiplier comprising:
   a first phase comparator,
   a lowpass filter for extracting DC voltage from an output signal of said first phase comparator;
   a first voltage control oscillator in which the oscillation frequency is controlled by an output signal of said first lowpass filter; and
   a K divider for dividing an output signal of said first voltage control oscillator by K
   wherein said first phase comparator receives an output signal of said K divider and said clock signal of said voltage control oscillator, and
   said first voltage control oscillator outputs a clock signal having the same frequency as bit rate of said input data signal.

18. A receiving apparatus including a clock/data recovery circuit, said clock/data recovery circuit comprising:
   a voltage control oscillator for generating a clock signal of a frequency of 1/K (K=2, 3, . . . ) of a bit rate of an input data signal;
   a delay circuit for delaying said input data signal for timing adjustment;
   a demultiplexer for demultiplexing said input data signal into M demultiplexed signals (M=2, 3, . . . ) by using said clock signal;
   a multiplexer for multiplexing said M demultiplexed signals by using said clock signal;
   a phase comparator for comparing phases of an output signal of said delay circuit and an output signal of said multiplexer;
   a lowpass filter for extracting DC voltage from an output signal of said phase comparator and inputting said DC voltage to said voltage control oscillator as a control voltage;
   wherein said clock/data recovery circuit outputs said clock signal generated by said voltage control oscillator as a recovery divided clock signal, and outputs said M demultiplexed signals output from said demultiplexer as recovery parallel data signals.

* * * * *